(12) United States Patent
Wang et al.

(10) Patent No.: US 10,177,722 B2
(45) Date of Patent: Jan. 8, 2019

(54) CARRIER AGGREGATION LOW-NOISE AMPLIFIER WITH TUNABLE INTEGRATED POWER SPLITTER

(71) Applicant: QUALCOMM Incorporated, San Diego, CA (US)

(72) Inventors: Chuan Wang, San Diego, CA (US); Kevin Hsi Huai Wang, San Diego, CA (US); Chiewcharn Narathong, Laguna Niguel, CA (US); Mehmet Uzunkol, San Diego, CA (US); Prakash Thoppay Egambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 51 days.

(21) Appl. No.: 15/178,529

(22) Filed: Jun. 9, 2016

(65) Prior Publication Data
US 2017/0201218 A1    Jul. 13, 2017

Related U.S. Application Data

(60) Provisional application No. 62/277,880, filed on Jan. 12, 2016.

(51) Int. Cl.
*H03H 7/38*    (2006.01)
*H03F 3/195*   (2006.01)
(Continued)

(52) U.S. Cl.
CPC .............. *H03F 3/195* (2013.01); *H03F 1/565* (2013.01); *H04B 1/401* (2013.01);
(Continued)

(58) Field of Classification Search
CPC .... H03F 3/195; H03F 1/565; H03F 2200/294; H03F 2200/378; H03F 2200/423;
(Continued)

(56) References Cited

U.S. PATENT DOCUMENTS 3,911,364 A    10/1975  Langseth et al.
4,035,728 A     7/1977  Ishikawa et al.
(Continued)

FOREIGN PATENT DOCUMENTS

CN    1523912 A    8/2004
CN    1801603 A    7/2006
(Continued)

OTHER PUBLICATIONS

International Search Report and Written Opinion—PCT/US2016/066203—ISA/EPO—dated Jul. 7, 2017.
(Continued)

*Primary Examiner* — Robert J Pascal
*Assistant Examiner* — Kimberly Glenn
(74) *Attorney, Agent, or Firm* — Qualcomm Incorporated/Seyfarth Shaw LLP

(57) ABSTRACT

A device includes a low-noise amplifier (LNA) and a matching circuit. The matching circuit is coupled to an output of the LNA and switchably coupled to at least one of a first and a second output of the device. The device may further include a power splitter switchably coupled between an output of the matching circuit and the first and/or the second output of the device.

20 Claims, 12 Drawing Sheets

(51) Int. Cl.
*H03F 1/56* (2006.01)
*H04B 1/401* (2015.01)
*H04W 88/02* (2009.01)

(52) U.S. Cl.
CPC .. *H03F 2200/294* (2013.01); *H03F 2200/378* (2013.01); *H03F 2200/423* (2013.01); *H03F 2200/451* (2013.01); *H03F 2200/541* (2013.01); *H04W 88/02* (2013.01)

(58) Field of Classification Search
CPC ......... H03F 2200/451; H03F 2200/541; H04B 1/401; H04W 88/02
USPC .................................. 333/124–129
See application file for complete search history.

(56) References Cited

U.S. PATENT DOCUMENTS

| | | |
|---|---|---|
| 4,035,729 A | 7/1977 | Perry |
| 4,246,655 A | 1/1981 | Parker |
| 4,326,294 A | 4/1982 | Okamoto et al. |
| 4,715,048 A | 12/1987 | Masamura |
| 4,742,563 A | 5/1988 | Fukumura |
| 4,756,023 A | 7/1988 | Kojima |
| 4,969,207 A | 11/1990 | Sakamoto et al. |
| 5,056,411 A | 10/1991 | Baker |
| 5,128,630 A | 7/1992 | Mijuskovic |
| 5,239,685 A | 8/1993 | Moe et al. |
| 5,291,519 A | 3/1994 | Tsurumaru |
| 5,321,850 A | 6/1994 | Backstrom et al. |
| 5,345,601 A | 9/1994 | Takagi et al. |
| 5,390,342 A | 2/1995 | Takayama et al. |
| 5,559,838 A | 9/1996 | Nakagoshi |
| 5,566,364 A | 10/1996 | Mizoguchi et al. |
| 5,694,396 A | 12/1997 | Firouzbakht et al. |
| 5,697,083 A | 12/1997 | Sano |
| 5,758,269 A | 5/1998 | Wu |
| 5,761,613 A | 6/1998 | Saunders et al. |
| 5,794,159 A | 8/1998 | Portin |
| 5,805,643 A | 9/1998 | Seki et al. |
| 5,805,989 A | 9/1998 | Ushida |
| 5,835,853 A | 11/1998 | Enoki et al. |
| 5,940,452 A | 8/1999 | Rich |
| 5,999,815 A | 12/1999 | Tenbrook et al. |
| 5,999,990 A | 12/1999 | Sharrit et al. |
| 6,026,288 A | 2/2000 | Bronner |
| 6,040,732 A | 3/2000 | Brokaw |
| 6,044,254 A | 3/2000 | Ohta et al. |
| 6,063,961 A | 5/2000 | Kroner |
| 6,069,923 A | 5/2000 | Ostman et al. |
| 6,088,348 A | 7/2000 | Bell, III et al. |
| 6,208,844 B1 | 3/2001 | Abdelgany |
| 6,249,687 B1 | 6/2001 | Thomsen et al. |
| 6,407,689 B1 | 6/2002 | Bazarjani et al. |
| 6,424,683 B1 | 7/2002 | Schollhorn |
| 6,430,237 B1 | 8/2002 | Anvari |
| 6,472,947 B1 | 10/2002 | Zeitz |
| 6,473,601 B1 | 10/2002 | Oda |
| 6,522,895 B1 | 2/2003 | Montalvo |
| 6,535,725 B2 | 3/2003 | Hatcher et al. |
| 6,600,759 B1 | 7/2003 | Wood |
| 6,600,907 B1 | 7/2003 | Taguchi |
| 6,600,931 B2 | 7/2003 | Sutton et al. |
| 6,657,498 B2 | 12/2003 | Park et al. |
| 6,728,517 B2 | 4/2004 | Sugar et al. |
| 6,806,777 B2 | 10/2004 | Franca-Neto |
| 6,819,941 B2 | 11/2004 | Dening et al. |
| 6,888,888 B1 | 5/2005 | Tu et al. |
| 6,952,594 B2 | 10/2005 | Hendin |
| 6,954,446 B2 | 10/2005 | Kuffner |
| 6,983,132 B2 | 1/2006 | Woo et al. |
| 6,985,712 B2 | 1/2006 | Yamakawa et al. |
| 6,987,950 B2 | 1/2006 | Coan |
| 7,013,166 B2 | 3/2006 | Clifford |
| 7,023,272 B2 | 4/2006 | Hung et al. |
| 7,024,172 B1 | 4/2006 | Murphy et al. |
| 7,039,377 B2 | 5/2006 | Yates |
| 7,123,891 B2 | 10/2006 | Loke |
| 7,142,042 B1 | 11/2006 | Henry |
| 7,161,423 B2 | 1/2007 | Paul et al. |
| 7,167,044 B2 | 1/2007 | Li et al. |
| 7,187,239 B2 | 3/2007 | Yeh |
| 7,187,735 B2 | 3/2007 | Kent, III et al. |
| 7,187,904 B2 | 3/2007 | Gainey et al. |
| 7,212,788 B2 | 5/2007 | Weber et al. |
| 7,224,231 B2 | 5/2007 | Wu |
| 7,260,377 B2 | 8/2007 | Burns et al. |
| 7,283,851 B2 | 10/2007 | Persico et al. |
| 7,299,021 B2 | 11/2007 | Parssinen et al. |
| 7,313,368 B2 | 12/2007 | Wu et al. |
| 7,317,894 B2 | 1/2008 | Hirose |
| 7,327,775 B1 | 2/2008 | Gu |
| 7,333,831 B2 | 2/2008 | Srinivasan et al. |
| 7,356,325 B2 | 4/2008 | Behzad et al. |
| 7,372,336 B2 | 5/2008 | Lee et al. |
| 7,403,508 B1 | 7/2008 | Miao |
| 7,444,166 B2 | 10/2008 | Sahota et al. |
| 7,454,181 B2 | 11/2008 | Banister et al. |
| 7,477,106 B2 | 1/2009 | Van Bezooijen et al. |
| 7,486,135 B2 | 2/2009 | Mu |
| 7,495,515 B1 * | 2/2009 | Branch ............... H03F 1/56 330/302 |
| 7,570,111 B1 | 8/2009 | Vagher et al. |
| 7,599,675 B2 | 10/2009 | Mu et al. |
| 7,643,847 B2 | 1/2010 | Daanen et al. |
| 7,643,848 B2 | 1/2010 | Robinett et al. |
| 7,697,905 B2 | 4/2010 | Lee et al. |
| 7,728,664 B2 | 6/2010 | Chang et al. |
| 7,751,513 B2 | 7/2010 | Eisenhut et al. |
| 7,764,726 B2 | 7/2010 | Simic et al. |
| 7,848,724 B2 | 12/2010 | Bult et al. |
| 7,869,528 B2 | 1/2011 | Robinson |
| 7,877,075 B1 | 1/2011 | Jin et al. |
| 7,911,269 B2 | 3/2011 | Yang et al. |
| 7,944,298 B2 | 5/2011 | Cabanillas et al. |
| 7,949,309 B2 | 5/2011 | Rofougaran et al. |
| 7,952,398 B2 | 5/2011 | Salcido et al. |
| 8,008,970 B1 | 8/2011 | Homol et al. |
| 8,022,772 B2 | 9/2011 | Cassia et al. |
| 8,055,229 B2 | 11/2011 | Huang |
| 8,063,706 B2 | 11/2011 | Li et al. |
| 8,081,672 B2 | 12/2011 | Kent et al. |
| 8,090,332 B2 | 1/2012 | Sahota et al. |
| 8,090,369 B2 | 1/2012 | Kitazoe |
| 8,139,670 B1 | 3/2012 | Son et al. |
| 8,149,955 B2 | 4/2012 | Tired |
| 8,195,117 B2 | 6/2012 | Bult et al. |
| 8,208,887 B2 | 6/2012 | Lee et al. |
| 8,217,723 B2 | 7/2012 | Rajendran et al. |
| 8,242,841 B2 | 8/2012 | Zhang |
| 8,270,499 B2 | 9/2012 | Chang et al. |
| 8,270,927 B2 | 9/2012 | Wallace et al. |
| 8,290,449 B2 | 10/2012 | Keehr et al. |
| 8,295,778 B2 | 10/2012 | Kotecha et al. |
| 8,306,494 B2 | 11/2012 | Ojo |
| 8,416,758 B1 | 4/2013 | Rousu et al. |
| 8,442,473 B1 | 5/2013 | Kaukovuori et al. |
| 8,483,647 B2 | 7/2013 | Kaukovuori et al. |
| 8,514,015 B2 | 8/2013 | Chen |
| 8,571,510 B2 | 10/2013 | Liu et al. |
| 8,600,315 B2 | 12/2013 | Roufoogaran et al. |
| 8,626,084 B2 | 1/2014 | Chan et al. |
| 8,676,148 B2 | 3/2014 | Ogasawara |
| 8,706,069 B2 | 4/2014 | Khoini-Poorfard et al. |
| 8,774,334 B2 | 7/2014 | Fernando |
| 8,903,343 B2 | 12/2014 | Holenstein et al. |
| 8,975,968 B2 | 3/2015 | Abdelhalem et al. |
| 8,995,591 B2 | 3/2015 | Gudem et al. |
| 9,026,070 B2 | 5/2015 | Persico et al. |
| 9,035,697 B2 | 5/2015 | Youssef et al. |
| 9,059,665 B2 | 6/2015 | Youssef et al. |
| 9,106,185 B2 | 8/2015 | Youssef et al. |
| 9,124,228 B2 | 9/2015 | Xu et al. |
| 9,154,356 B2 | 10/2015 | Tasic et al. |

(56) References Cited

U.S. PATENT DOCUMENTS

| | | |
|---|---|---|
| 9,154,357 B2 | 10/2015 | Tasic et al. |
| 9,160,598 B2 | 10/2015 | Davierwalla et al. |
| 9,166,852 B2 | 10/2015 | Davierwalla et al. |
| 9,178,669 B2 | 11/2015 | Fernando |
| 9,431,963 B2 | 8/2016 | Wang et al. |
| 9,595,933 B2 * | 3/2017 | Zhao ............... H03G 3/3042 |
| 2002/0008575 A1 | 1/2002 | Oskowsky et al. |
| 2002/0061773 A1 | 5/2002 | Adachi et al. |
| 2002/0106010 A1 | 8/2002 | Jones |
| 2002/0111163 A1 | 8/2002 | Hamabe |
| 2002/0132597 A1 | 9/2002 | Peterzell et al. |
| 2002/0173337 A1 | 11/2002 | Hajimiri et al. |
| 2002/0193108 A1 | 12/2002 | Robinett |
| 2003/0076797 A1 | 4/2003 | Lozano |
| 2003/0081694 A1 | 5/2003 | Wieck |
| 2003/0125040 A1 | 7/2003 | Walton et al. |
| 2003/0148750 A1 | 8/2003 | Yan et al. |
| 2003/0157915 A1 | 8/2003 | Atkinson et al. |
| 2003/0176176 A1 | 9/2003 | Leinonen et al. |
| 2003/0206076 A1 | 11/2003 | Hashemi et al. |
| 2003/0228851 A1 | 12/2003 | Taniguchi |
| 2004/0087290 A1 | 5/2004 | Schmidt et al. |
| 2004/0092243 A1 | 5/2004 | Hey-Shipton |
| 2004/0113746 A1 | 6/2004 | Brindle |
| 2004/0116086 A1 | 6/2004 | Huttunen |
| 2004/0121753 A1 | 6/2004 | Sugar et al. |
| 2004/0204104 A1 | 10/2004 | Horng et al. |
| 2004/0219959 A1 | 11/2004 | Khayrallah et al. |
| 2004/0224643 A1 | 11/2004 | Nakai |
| 2004/0248532 A1 | 12/2004 | Khoini-Poorfard |
| 2004/0253955 A1 | 12/2004 | Love et al. |
| 2004/0266356 A1 | 12/2004 | Javor et al. |
| 2005/0012432 A1 | 1/2005 | Murphy |
| 2005/0039060 A1 | 2/2005 | Okayasu |
| 2005/0075077 A1 | 4/2005 | Mach et al. |
| 2005/0079847 A1 | 4/2005 | Arafa |
| 2005/0118977 A1 | 6/2005 | Drogi et al. |
| 2005/0197090 A1 | 9/2005 | Stockstad et al. |
| 2005/0215264 A1 | 9/2005 | Subramaniam et al. |
| 2005/0265084 A1 | 12/2005 | Choi |
| 2005/0277387 A1 | 12/2005 | Kojima et al. |
| 2006/0023745 A1 | 2/2006 | Koo et al. |
| 2006/0061773 A1 | 3/2006 | Lee et al. |
| 2006/0121937 A1 | 6/2006 | Son |
| 2006/0128322 A1 | 6/2006 | Igarashi et al. |
| 2006/0146693 A1 | 7/2006 | Mori et al. |
| 2006/0189286 A1 | 8/2006 | Kyu et al. |
| 2006/0222100 A1 | 10/2006 | Behzad |
| 2006/0234662 A1 | 10/2006 | Diloisy |
| 2006/0291428 A1 | 12/2006 | Filipovic |
| 2007/0049332 A1 | 3/2007 | Higuchi |
| 2007/0060080 A1 | 3/2007 | Nishimura et al. |
| 2007/0072577 A1 | 3/2007 | Rozenblit et al. |
| 2007/0105517 A1 | 5/2007 | Chang et al. |
| 2007/0142013 A1 | 6/2007 | Bucknor et al. |
| 2007/0177656 A1 | 8/2007 | Maruta et al. |
| 2007/0177693 A1 | 8/2007 | Kluge |
| 2007/0184801 A1 | 8/2007 | Kogawa et al. |
| 2007/0184811 A1 | 8/2007 | Ballantyne et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0207752 A1 | 9/2007 | Behzad |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0004078 A1 | 1/2008 | Barratt et al. |
| 2008/0013654 A1 | 1/2008 | Rick et al. |
| 2008/0117999 A1 | 5/2008 | Kadous et al. |
| 2008/0139151 A1 | 6/2008 | Ojo et al. |
| 2008/0139154 A1 | 6/2008 | Behzad et al. |
| 2008/0180168 A1 | 7/2008 | Itkin et al. |
| 2008/0204148 A1 | 8/2008 | Kim et al. |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0090767 A1 | 4/2010 | Ohnishi et al. |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstroem et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1 | 10/2010 | Ichitsubo et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1 | 8/2011 | Hu et al. |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2011/0300816 A1 | 12/2011 | Collados et al. |
| 2011/0300821 A1 | 12/2011 | Wang |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0322394 A1 | 12/2012 | Chien |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0043946 A1 | 2/2013 | Hadjichristos et al. |
| 2013/0051284 A1 | 2/2013 | Khlat |
| 2013/0127564 A1 * | 5/2013 | Ding ..................... H01P 5/16 |
| | | 333/125 |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |

(56) References Cited

U.S. PATENT DOCUMENTS

| | | |
|---|---|---|
| 2013/0265892 A1 | 10/2013 | Fernando |
| 2013/0329665 A1 | 12/2013 | Kadous et al. |
| 2014/0072001 A1 | 3/2014 | Chang et al. |
| 2014/0113578 A1 | 4/2014 | Xu et al. |
| 2014/0134960 A1 | 5/2014 | Tasic et al. |
| 2014/0170999 A1 | 6/2014 | Aparin et al. |
| 2015/0084701 A1 | 3/2015 | Perreault et al. |
| 2015/0087245 A1 | 3/2015 | Hadji-Abdolhamid et al. |
| 2015/0180694 A1 | 6/2015 | Bellaouar |
| 2015/0200690 A1 | 7/2015 | Youssef et al. |
| 2015/0237583 A1 | 8/2015 | Hassan et al. |
| 2015/0257022 A1 | 9/2015 | Kohlmann et al. |
| 2015/0288400 A1* | 10/2015 | Nguyen ............ H04B 1/126 455/136 |
| 2016/0036392 A1 | 2/2016 | Bohsali et al. |
| 2016/0079946 A1 | 3/2016 | Rajendran et al. |
| 2016/0164547 A1* | 6/2016 | Kim ............ H04B 1/0057 455/266 |
| 2016/0248378 A1 | 8/2016 | Zhang |

FOREIGN PATENT DOCUMENTS

| | | |
|---|---|---|
| CN | 1913379 A | 2/2007 |
| CN | 1922795 A | 2/2007 |
| CN | 1954489 A | 4/2007 |
| CN | 101228702 A | 7/2008 |
| CN | 101242158 A | 8/2008 |
| CN | 101473547 A | 7/2009 |
| CN | 101523967 A | 9/2009 |
| CN | 101674052 A | 3/2010 |
| CN | 101789805 A | 7/2010 |
| CN | 101867542 A | 10/2010 |
| CN | 102045825 A | 5/2011 |
| EP | 1164719 A1 | 12/2001 |
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | S6416746 U | 1/1989 |
| JP | H03214930 A | 9/1991 |
| JP | 05227234 | 9/1993 |
| JP | H0730452 A | 1/1995 |
| JP | H0738404 A | 2/1995 |
| JP | 07221684 | 8/1995 |
| JP | 9027778 A | 1/1997 |
| JP | 09116458 | 5/1997 |
| JP | 111127300 A | 5/1999 |
| JP | 2000013278 A | 1/2000 |
| JP | 2001285114 A | 10/2001 |
| JP | 2002261880 A | 9/2002 |
| JP | 2004015162 A | 1/2004 |
| JP | 2004023677 A | 1/2004 |
| JP | 2006510247 A | 3/2006 |
| JP | 2006520143 A | 8/2006 |
| JP | 2006325163 A | 11/2006 |
| JP | 2007324711 A | 12/2007 |
| JP | 2008016927 A | 1/2008 |
| JP | 2008085793 A | 4/2008 |
| JP | 2008519535 A | 6/2008 |
| JP | 2009027778 | 2/2009 |
| JP | 2009130867 A | 6/2009 |
| JP | 2011015112 A | 1/2011 |
| JP | 2011082669 A | 4/2011 |
| JP | 2011091747 A | 5/2011 |
| JP | 2011119807 A | 6/2011 |
| JP | 2014093741 A | 5/2014 |
| WO | 01050636 | 7/2001 |
| WO | 2002037686 | 5/2002 |
| WO | 2004054128 A2 | 6/2004 |
| WO | 05039060 | 4/2005 |
| WO | 2005062477 A2 | 7/2005 |
| WO | 2005064816 A1 | 7/2005 |
| WO | 2005088847 A1 | 9/2005 |
| WO | 2005104389 A1 | 11/2005 |
| WO | 2005104390 A1 | 11/2005 |
| WO | 2006050515 A2 | 5/2006 |
| WO | 2006118538 A2 | 11/2006 |
| WO | 2007002414 A2 | 1/2007 |
| WO | 2008059257 A1 | 5/2008 |
| WO | 2008084539 A1 | 7/2008 |
| WO | 2008092745 A1 | 8/2008 |
| WO | 2008103757 A1 | 8/2008 |
| WO | 2008145604 A1 | 12/2008 |
| WO | 2009117713 | 9/2009 |
| WO | 2010022093 A1 | 2/2010 |
| WO | 2010059257 A1 | 5/2010 |
| WO | 2010082235 A1 | 7/2010 |
| WO | 2010132870 | 11/2010 |
| WO | 2010141908 A1 | 12/2010 |
| WO | 2010151847 A1 | 12/2010 |
| WO | 2011019850 A1 | 2/2011 |
| WO | 2011050729 A1 | 5/2011 |
| WO | 2011092005 A1 | 8/2011 |
| WO | 2011134504 A1 | 11/2011 |
| WO | 2011138697 A1 | 11/2011 |
| WO | 2012008705 A2 | 1/2012 |
| WO | 2012021879 A2 | 2/2012 |
| WO | 2012049529 A1 | 4/2012 |
| WO | 2012158976 A1 | 11/2012 |
| WO | 2013036794 A1 | 3/2013 |
| WO | 2013131047 | 9/2013 |

OTHER PUBLICATIONS

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

Aparin et al., "A Highly-integrated hi-band/quad-mode SiGe BiCMOS RF-to-baseband and receiver for wireless CDMA/WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Broyde F., et al., "The Noise Performance of aMultiple-Input-Port and Multiple-Output-Port Low-Noise Amplifier connected to an Array of Coupled Antennas," International Journal of Antennas and Propagation, vol. 2011, Article ID 438478, Jul. 18, 2011, 12 pages.

Chen, et al, "A 5-6 GHz 1-V CMOS Direct-Conversion Receiver With an Integrated Quadrature Coupler," IEEE Journal of Solid-State Circuits, vol. 42, No. 9, 2007, pp. 1963-1975.

Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, 2006, pp. 197-199.

European Search Report—EP10007688—Search Authority—Munich—dated Oct. 11, 2012.

European Search Report—EP10007689—Search Authority—Munich—dated Oct. 17, 2012.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Hashemi H., et al., "Concurrent Multiband Low-Noise Amplifiers—Theory, Design, and Applications", IEEE Transactions on Microwave Theory and Techniques, vol. 50, No. 1, Jan. 2002, pp. 288-301.

Henrik M et al., "A Full Duplex Front End Module for WiFi 802.11.n. Applications", European Microwave Association, vol. 12, No. 4, Oct. 2008, pp. 162-165.

Hwang, et al., "A High IIP2 Direct-Conversion Receiver using Even-Harmonic Reduction Technique for Cellular CDMA/PCS/GPS applications," IEEE Transaction on Circuits and Systems, 2008.

(56) References Cited

OTHER PUBLICATIONS

International Search Authority,PCT/US2006/060082, dated Jul. 2, 2007.
International Search Report and Written Opinion—PCT/US2004/042783, International Search Authority—European Patent Office—dated Apr. 26, 2005.
International Search Report and Written Opinion—PCT/US2012/038453—ISA/EPO—dated Oct. 5, 2012.
International Search Report and Written Opinion—PCT/US2012/044473—ISA/EPO—dated Jan. 15, 2013.
International Search Report and Written Opinion—PCT/US2012/045129—ISA/EPO—dated Nov. 7, 2012.
International Search Report and Written Opinion—PCT/US2012/051237—ISA/EPO—dated Dec. 6, 2012.
International Search Report and Written Opinion—PCT/US2012/064513—ISA/EPO—dated Feb. 5, 2013.
International Search Report and Written Opinion—PCT/US2013/028737—ISA/EPO—dated Jul. 5, 2013.
International Search Report and Written Opinion—PCT/US2013/028742—ISA/EPO—dated Jul. 5, 2013.
International Search Report and Written Opinion—PCT/US2013/035526—ISA/EPO—dated Jul. 9, 2013.
International Search Report and Written Opinion—PCT/US2013/042726—ISA/EPO—dated Oct. 2, 2013.
International Search Report and Written Opinion—PCT/US2013/042741—ISA/EPO—dated Aug. 26, 2013.
International Search Report and Written Opinion—PCT/US2013/042748—ISA/EPO—dated Oct. 14, 2013.
International Search Report and Written Opinion—PCT/US2013/042761—ISA/EPO—dated Sep. 20, 2013.
International Search Report and Written Opinion—PCT/US2013/045461—ISA/EPO—dated Sep. 20, 2013.
International Search Report and Written Opinion—PCT/US2013/059308—ISA/EPO—dated Nov. 26, 2013.
International Search Report and Written Opinion—PCT/US2013/066230—ISAEPO—dated Dec. 3, 2013.
International Search Report and Written Opinion—PCT/US2014/022773—ISA/EPO—dated Jul. 1, 2014.
International Search Report and Written Opinion—PCT/US2015/045707—ISA/EPO—dated Nov. 20, 2015.
International Search Report, PCT/US05/004861—International Search Authority—European Patent Office—dated May 19, 2005.
Jones W. W., et al., "Narrowband interference suppression using filter-bank analysis/synthesis techniques", Military Communications Conference, 1992. MILC0M '92, Conference Recor D. Communications—Fusing Command, Control and Intelligence, IEEE San Diego, CA, USA, Oct. 11-14, 1992, New York, NY, USA, IEEE, US, Oct. 11, 1992 (Oct. 11, 1992), pp. 898-902, XP010060840, DOI: 10.1109/MILCOM.1992.243977, ISBN: 978-0-7803-0585-4.

Jussi R et al., "A Dual-Band RF Front-End for WCDMA and GSM Applications", IEEE, Journal Solid-State Circuits, 2001, vol. 36, No. 8, pp. 1198-1204.
Kevin W et al., "3G/4G Multimode Cellular Front End Challenges", Part 2: Architecture Discussion, RFMD® White Japer, 2009, 9 pages.
Kim, T.W., et al., Highly Linear Receiver Front-End Adopting MOSFET Transconductance Linearization by Multiple Sated Transistors, IEEE Journal of Solid-State Circuits, United States, IEEE, Jan. 1, 2004, vol. 39, No. 1, pp. 223-229.
Lai, C.M.,et al., "Compact router transceiver architecture for carrier aggregation systems", Microwave Conference (EUMC), 2011 41st European, IEEE, Oct. 10, 2011 (Oct. 10, 2011), pp. 693-696, XP032072825, ISBN: 978-1-61284-235-6 the whole document.
Lee et al., "Development of Miniature Quad SAW filter bank based on PCB substrate", IEEE Intl Frequency Control Symp, pp. 146-149, 2007.
MSM6000 Chipset Solution, Qualcomm Incorporated, 2003.
MSM6500 Chipset Solution, Qualcomm Incorporated, 2004.
Partial International Search Report—PCT/US2012/038453—ISA/EPO—dated Aug. 21, 2012.
Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. RAN WG1, No. Dresden, Germany; Jun. 28, 2010, Jun. 22, 2010 (Jun. 22, 2010), XP050449298, [retrieved on Jun. 22, 2010] the whole document.
Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.
Qualcomm Europe: "UE Implementation Impact due to 4C-HSDPA Operation", 3GPP Draft; R1-094067_UE_IMPL_IMPACT_4C_HSDPA, 3rd Generation Partnership Project (3GPP), Mobile Competence Centre; 650, Route Des Lucioles ; F-06921 Sophia-Antipolis Cedex ; France, no. Miyazaki; Oct. 12, 2009, Oct. 12, 2009 (Oct. 12, 2009), XP050388547, [retrieved on Oct. 6, 2009].
Rahn D.G., et al., "A Fully Integrated Multiband MIMO WLAN Transceiver RFIC," IEEE Journal of Solid-State Circuits, Aug. 2005, vol. 40 (8), pp. 1629-1641.
Sever et al. "A Dual-Antenna Phase-Array Ultra-Wideband CMOS Transceiver". IEEE Communications Magazine [Online] 2006, vol. 44, Issue 8, pp. 102-110. See pp. 104-107.
Tasic A. et al., "Design of Adaptive Multimode RF Front-End Circuits", IEEE Journal of Solid-State Circuits, vol. 42, Issue 2, Feb. 2007 pp. 313-322.
"UMTS Picocell Front End Module", CTS Corp. 8 pages. 2011 via archive.org/web.
Winternitz, et al., "A GPS Receiver for High-Altitude Satellite Navigation," IEEE Journal of Selected Topics in Signal Processing, vol. 3, No. 4, pp. 541-556, Aug. 2009.
Written Opinion—PCT/US2006/060082, International Search Authority, European Patent Office, dated Feb. 7, 2007.

\* cited by examiner

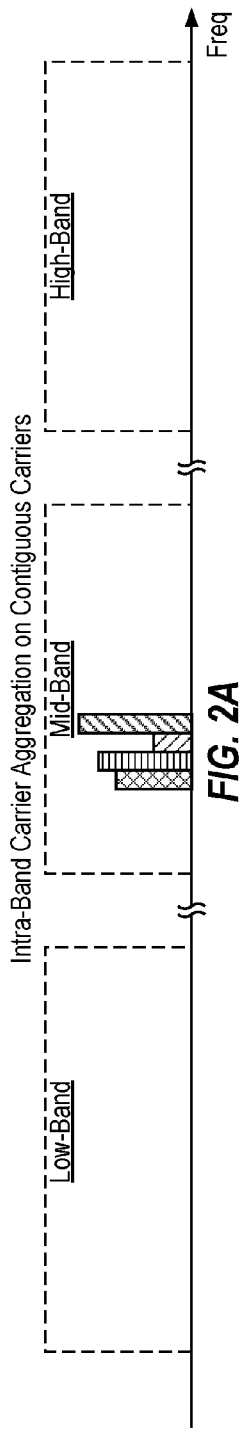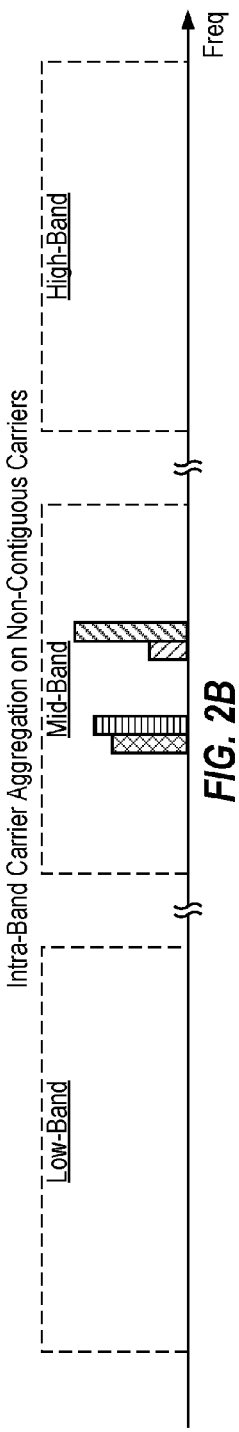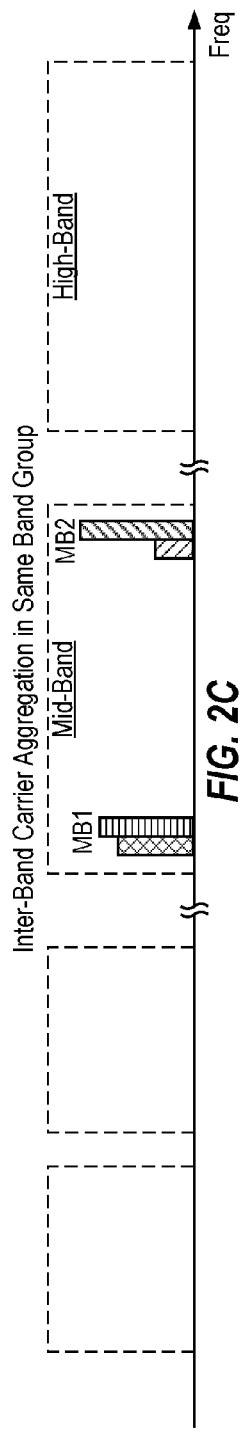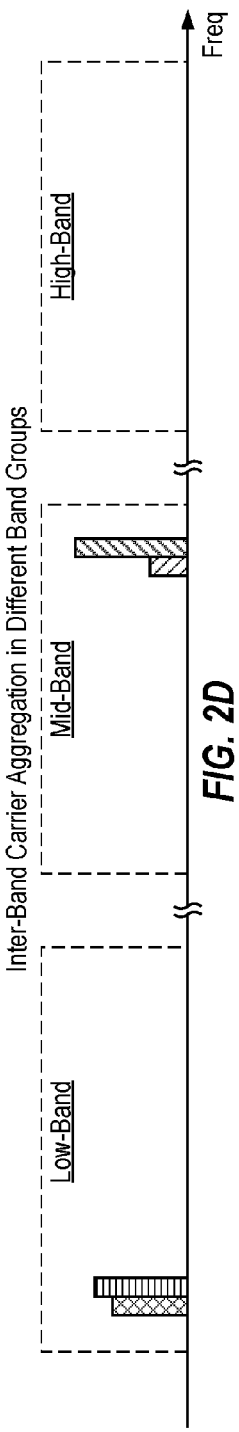
FIG. 2A — Intra-Band Carrier Aggregation on Contiguous Carriers
FIG. 2B — Intra-Band Carrier Aggregation on Non-Contiguous Carriers
FIG. 2C — Inter-Band Carrier Aggregation in Same Band Group
FIG. 2D — Inter-Band Carrier Aggregation in Different Band Groups

US 10,177,722 B2

CARRIER AGGREGATION LOW-NOISE AMPLIFIER WITH TUNABLE INTEGRATED POWER SPLITTER

CROSS REFERENCE TO RELATED APPLICATION

This application claims the benefit under 35 U.S.C. § 119(e) to U.S. Provisional Application No. 62/277,880, filed on Jan. 12, 2016, and titled "CARRIER AGGREGATION LOW-NOISE AMPLIFIER," the disclosure of which is expressly incorporated by reference herein in its entirety.

BACKGROUND

Field

The present disclosure relates generally to electronic devices. More specifically, the present disclosure relates to low-noise amplifiers.

Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

SUMMARY

In an aspect of the present disclosure, a device is presented. The device includes a low-noise amplifier (LNA) and a matching circuit coupled to an output of the LNA. The matching circuit is also switchably coupled to one or more outputs of the device. The device further includes a power splitter switchably coupled between an output of the matching circuit and the one or more outputs of the device.

In another aspect of the present disclosure, a method is presented. The method includes amplifying a signal with a low-noise amplifier (LNA). The method also includes configuring at least one switch to either convey the amplified signal to one or more outputs or to convey the amplified signal to the one or more outputs via a power splitter.

In yet another aspect of the present disclosure a device is presented. The device includes means for amplifying a signal. The device also includes means for configuring at least one switch to convey the amplified signal to one or more outputs or to convey the amplified signal to the one or more outputs via a power splitter.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

FIGS. 2A-2D show four examples of carrier aggregation, according to aspects of the present disclosure.

DETAILED DESCRIPTION

The detailed description set forth below in connection with the appended drawings is intended as a description of exemplary embodiments and is not intended to represent the only embodiments that can be practiced. The term "exemplary" used throughout this description means "serving as an example, instance, or illustration," and should not necessarily be construed as preferred or advantageous over other exemplary embodiments. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches.

The detailed description includes specific details for the purpose of providing a thorough understanding of the exemplary embodiments. It will be apparent to those skilled in the art that the exemplary embodiments may be practiced without these specific details. In some instances, well-known structures and devices are shown in block diagram form in order to avoid obscuring the novelty of the exemplary embodiments presented herein. Other aspects, as well as features and advantages of various aspects, will become apparent to those of skill in the art through consideration of the ensuing description, the accompanying drawings and the appended claims.

Figure 1:
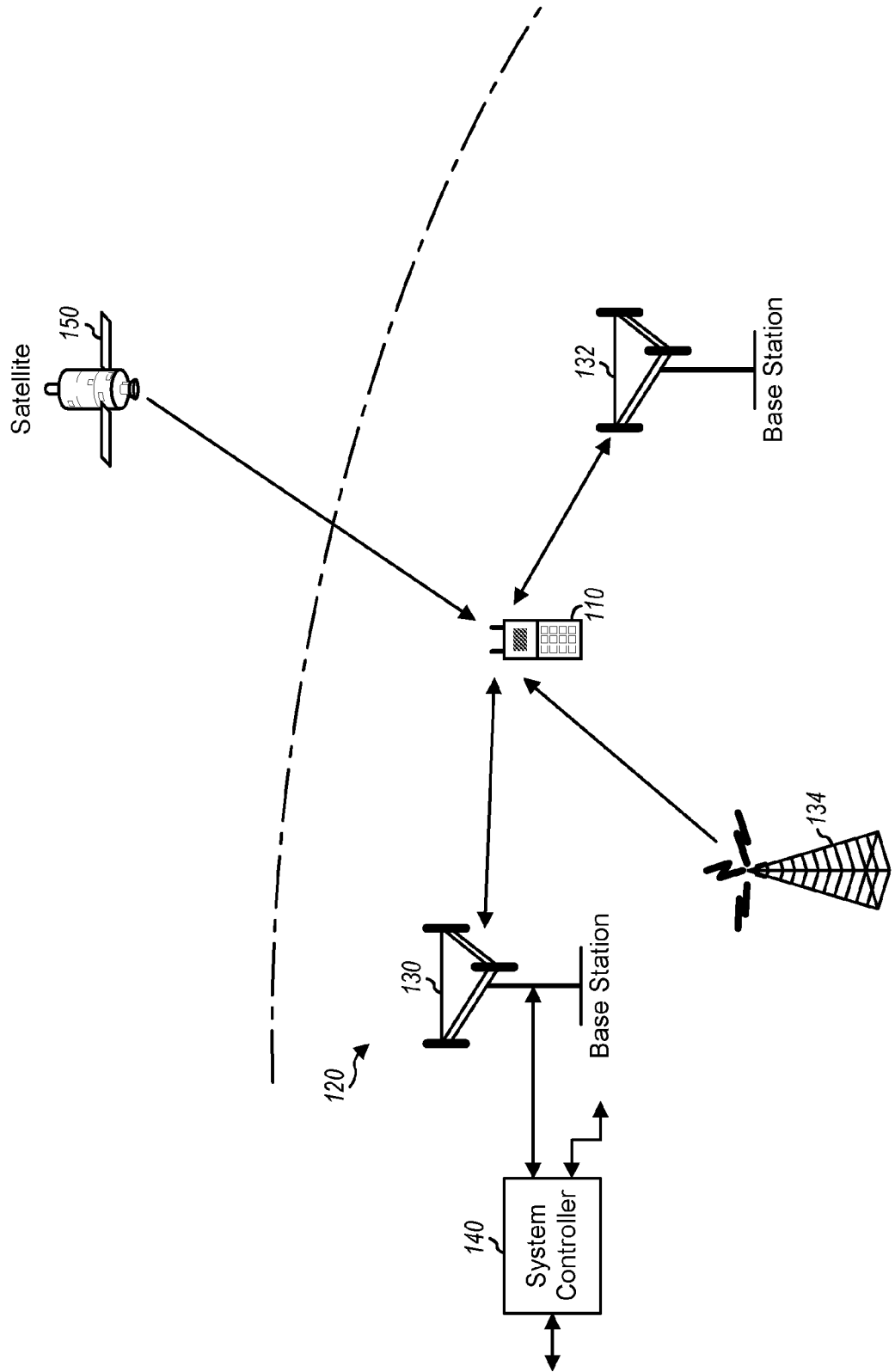
FIG. 1 shows a wireless device communicating with a wireless system, according to an aspect of the present disclosure.

FIG. 1 shows a wireless device 110 communicating with a wireless communication system 120. Wireless system 120 may be a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows wireless system 120 including two base stations 130 and 132 and one system controller 140. In general, a wireless system may include any number of base stations and any number of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, CDMA2000, WCDMA, TD-SCDMA, GSM, 802.11, etc.

Wireless device 110 may support carrier aggregation, which is operation on multiple carriers. Carrier aggregation may also be referred to as multi-carrier operation. According to an aspect of the present disclosure, wireless device 110 may be able to operate in low-band from 698 to 960 megahertz (MHz), mid-band from 1475 to 2170 MHz, and/or high-band from 2300 to 2690, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. Wireless device 110 may be configured with up to 5 carriers in one or two bands in LTE Release 11.

In general, carrier aggregation (CA) may be categorized into two types: intra-band CA and inter-band CA. Intra-band CA refers to operation on multiple carriers within the same band and inter-band CA refers to operation on multiple carriers in different bands.

FIG. 2A shows an example of contiguous intra-band CA. In the example shown in FIG. 2A, a wireless device (e.g., wireless device 110) is configured with four contiguous carriers in the same band, which is a band in mid-band. The wireless device may send and/or receive transmissions on multiple contiguous carriers within the same band.

FIG. 2B shows an example of non-contiguous intra-band CA. In the example shown in FIG. 2B, a wireless device (e.g., wireless device 110) is configured with four non-contiguous carriers in the same band, which is a band in mid-band. The carriers may be separated by 5 MHz, 10 MHz, or some other amount. The wireless device may send and/or receive transmissions on multiple non-contiguous carriers within the same band.

FIG. 2C shows an example of inter-band CA in the same band group. In the example shown in FIG. 2C, a wireless device (e.g., wireless device 110) is configured with four carriers in two bands in the same band group, which is mid-band. The wireless device may send and/or receive transmissions on multiple carriers in different bands in the same band group (e.g., Mid-Band 1 (MB1) and Mid-Band 2 (MB2) in FIG. 2C).

FIG. 2D shows an example of inter-band CA in different band groups. In the example shown in FIG. 2D, a wireless device (e.g., wireless device 110) is configured with four carriers in two bands in different band groups, which include two carriers in one band in low-band and two additional carriers in another band in mid-band. The wireless device may send and/or receive transmissions on multiple carriers in different bands in different band groups (e.g., low-band and mid-band in FIG. 2D). FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, and other band combinations with ultra-high band and long-term evolution in unlicenced spectrum (LTE-U).

Figure 3:
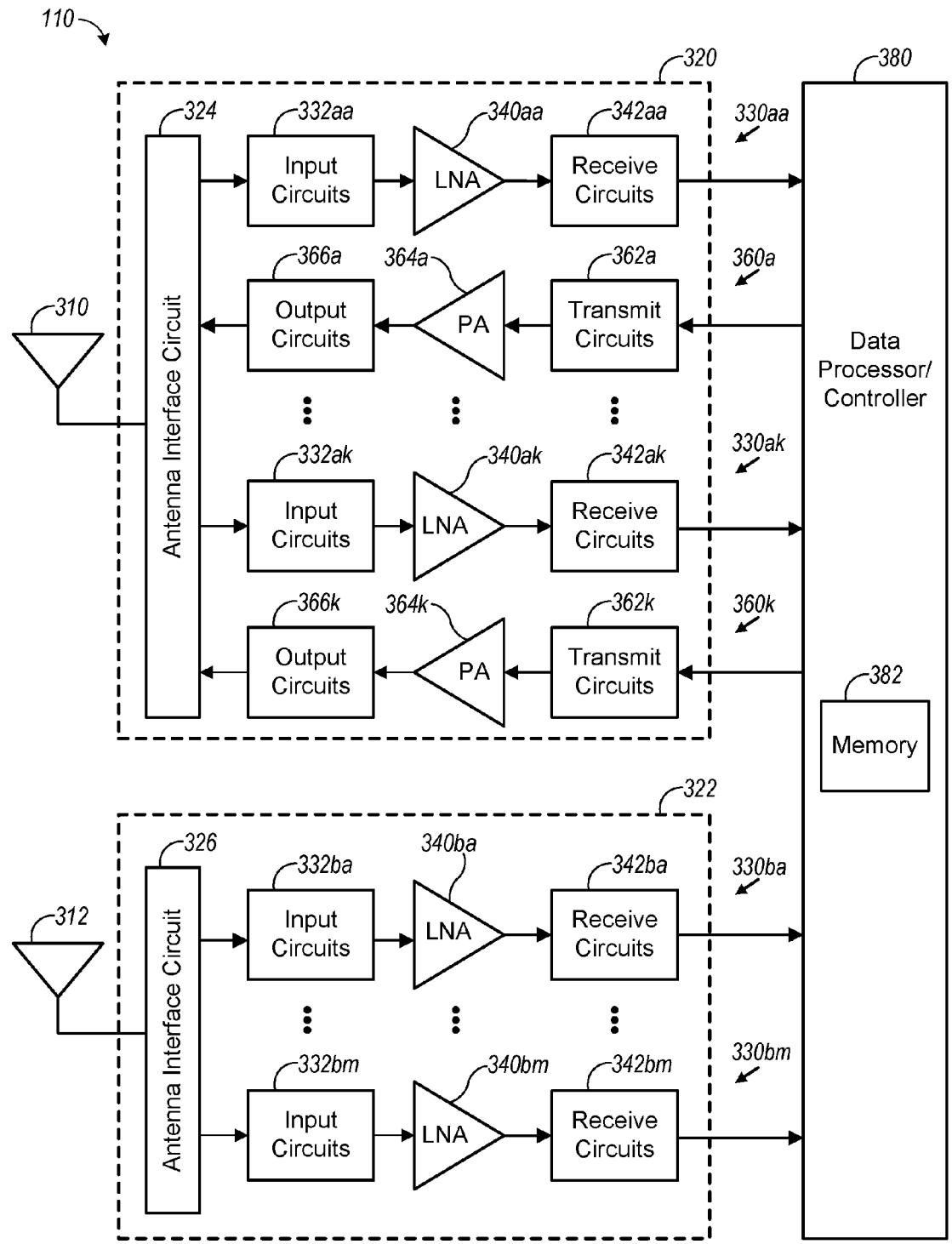
FIG. 3 shows a block diagram of the wireless device in FIG. 1, according to an aspect of the present disclosure.

FIG. 3 shows a block diagram of an exemplary design of wireless device 110 in FIG. 1. In this exemplary design, wireless device 110 includes a transceiver 320 coupled to a primary antenna 310, receivers 322 coupled to a secondary antenna 312, and a data processor/controller 380. Transceiver 320 includes multiple (K) receivers 330aa to 330ak and multiple (K) transmitters 360a to 360k to support multiple bands, carrier aggregation, multiple radio technologies, etc. Receivers 322 include multiple (M) receivers 330ba to 330bm to support multiple bands, carrier aggregation, multiple radio technologies, receive diversity, MIMO transmission from multiple transmit antennas to multiple receive antennas, etc.

In the exemplary design shown in FIG. 3, each receiver 330 includes input circuits 332, a low-noise amplifier (LNA) 340, and receive circuits 342. For data reception, antenna 310 receives signals from base stations and/or other transmitter stations and provides a received RF signal, which is routed through an antenna interface circuit 324 and provided to a selected receiver. Antenna interface circuit 324 may include switches, duplexers, transmit filters, receive filters, etc. The description below assumes that receiver 330aa is the selected receiver. Within receiver 330aa, the received RF signal is passed through input circuits 332aa, which provides an input RF signal to an LNA 340aa. Input circuits 332aa may include a matching circuit, a receive filter, etc.

LNA 340aa amplifies the input RF signal and provides an output RF signal. Receive circuits 342aa amplify, filter, and downconvert the output RF signal from RF to baseband and provide an analog input signal to data processor 380. Receive circuits 332 aa may include mixers, filters, amplifiers, matching circuits, an oscillator, a local oscillator (LO) generator, a phase locked loop (PLL), etc. Each remaining receiver 330 in transceiver 320 and each receiver 330 in receivers 322 may operate in similar manner as receiver 330aa in transceiver 320.

In the exemplary design shown in FIG. 3, each transmitter 360 includes transmit circuits 362, a power amplifier (PA) 364, and output circuits 366. For data transmission, data processor 380 processes (e.g., encodes and modulates) data to be transmitted and provides an analog output signal to a selected transmitter. The description below assumes that transmitter 360a is the selected transmitter. Within transmitter 360a, transmit circuits 362a amplify, filter, and upconvert the analog output signal from baseband to RF and provide a modulated RF signal. Transmit circuits 362a may include amplifiers, filters, mixers, matching circuits, an oscillator, an LO generator, a PLL, etc. A PA 364a receives and amplifies the modulated RF signal and provides a transmit RF signal having the proper output power level. The transmit RF signal is passed through output circuits 366a, routed through antenna interface circuit 324, and transmitted via antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of transceiver 320 and receivers 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Antenna interface circuits 324 and 326, input circuits 332, output circuits 366, and PAs 364 may be implemented on another module, which may be a hybrid module, etc. The circuits in transceiver 320 and receivers 322 may also be implemented in other manners.

Data processor/controller 380 may perform various functions for wireless device 110. For example, data processor 380 may perform processing for data being received via receivers 330 and data being transmitted via transmitters 360. Controller 380 may control the operation of antenna interface circuits 324 and 326, input circuits 332, LNAs 340, receive circuits 342, transmit circuits 362, PAs 364, output circuits 366, or a combination thereof. A memory 382 may store program codes and data for data processor/controller 380. Data processor/controller 380 may be implemented on one or more application specific integrated circuits (ASICs) and/or other ICs.

Wireless device 110 may receive transmissions from one or more base stations/cells on multiple carriers at different frequencies for carrier aggregation. For intra-band CA, the transmissions are sent on different carriers in the same band. For inter-band CA, the transmissions are sent on multiple carriers in different bands.

Figure 4:
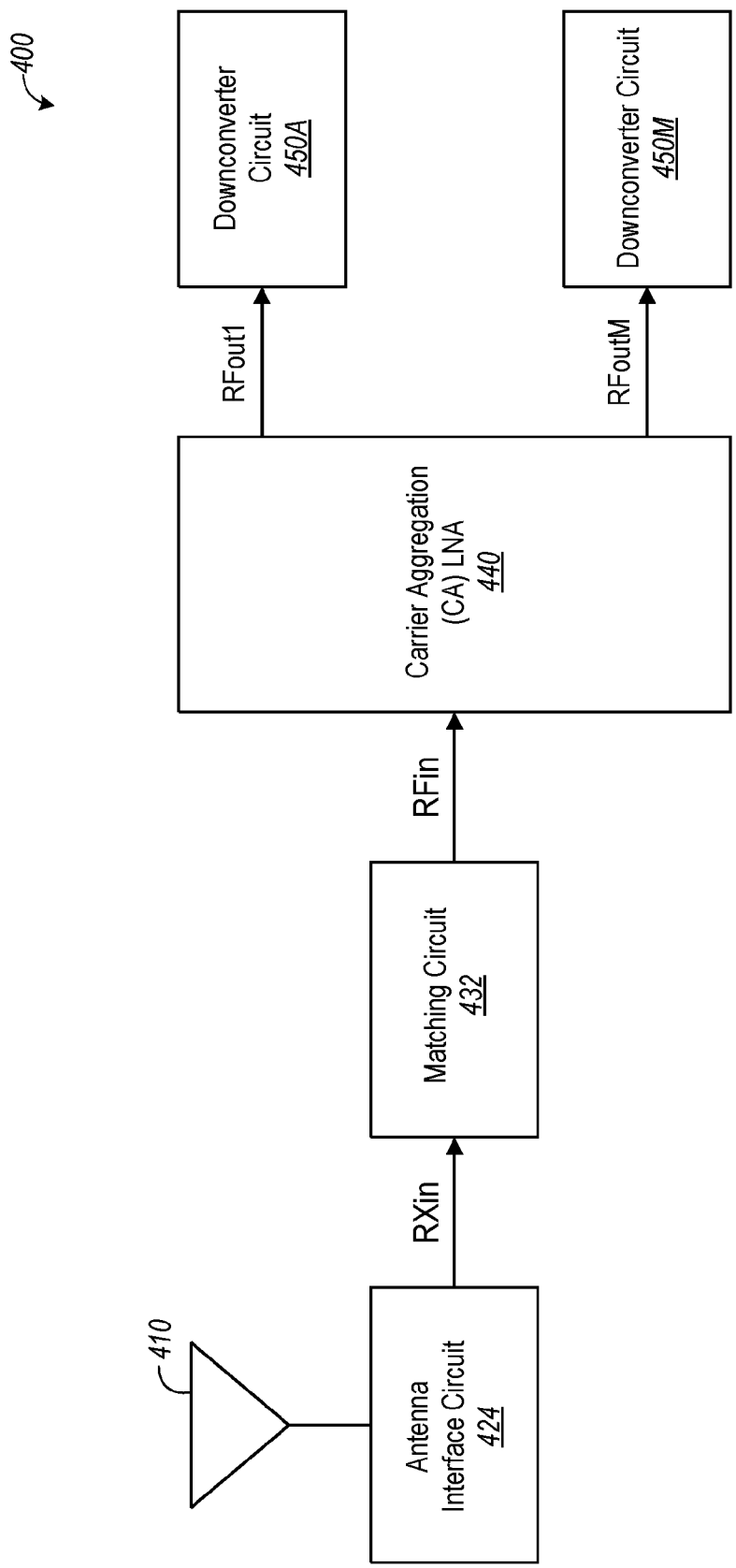
FIG. 4 shows a receiver supporting carrier aggregation, in accordance with an aspect of the present disclosure.

FIG. 4 shows a block diagram of an exemplary design of a receiver 400 with a carrier aggregation (CA) low-noise amplifier (LNA) 440 configured to support intra-band or inter-band CA. CA LNA 440 may be used for one or more LNAs 340 shown in FIG. 3. CA LNA 440 includes single input and multiple (M) outputs, where M>1.

At receiver 400, an antenna 410 may receive downlink signals comprising one or more transmissions sent on one or more carriers and provide a received RF signal to an antenna interface circuit 424. Antenna interface circuit 424 may filter and route the received RF signal and provide a receiver input signal, RXin. An input matching circuit 432 may receive the RXin signal and provide an input RF signal, RFin, to CA LNA 440. Matching circuit 432 may perform impedance and/or power matching between CA LNA 440 and either antenna interface circuit 424 or antenna 410 for a band of interest. Matching circuit 432 may be part of one of input circuits 332 in FIG. 3.

CA LNA 440 may receive and amplify the input RFin signal and provide (i) one output RF signal via one LNA output for either no CA or CA on one set of carriers or (ii) up to M output RF signals, RFout1 to RFoutM, via up to M LNA outputs for intra-band CA on up to M sets of carriers. In some aspects, receiver 400 may comprise a wideband LNA with a bandwidth defined to accommodate or facilitate inter-band CA using an LNA. For example, CA LNA 440 may receive multiple inputs and generates multiple outputs to support inter-band carrier aggregation within one LNA, which utilizes wide matching bandwidth and also limits the isolation between inter-band carriers. M downconverter circuits 450A to 450M are coupled to the M LNA outputs. Each downconverter circuit 450, when enabled, may downconvert an associated output RF signal such that one or more transmissions on one or more carriers of interest are downconverted from RF to baseband.

A CA LNA, such as CA LNA 440 in FIG. 4, may operate in a single-output mode or a multi-output mode at any given moment. In the single-output mode, the CA LNA operates in a 1-input to 1-output (1×1) configuration, and receives one input RF signal comprising one or more transmissions on one set of carriers, and provides one output RF signal to one downconverter circuit. The single-output mode may be used to receive a transmission sent on a single carrier without carrier aggregation. The single-output mode may also be used to receive transmissions sent on multiple carriers (e.g., contiguous carriers) with carrier aggregation. In this case, the transmissions on all carriers may be downconverted with a single local oscillator (LO) signal at a single frequency. In the multi-output mode, the CA LNA operates in a 1×M configuration, receives one input RF signal comprising multiple transmissions on M sets of carriers, and provides M output RF signals to M downconverter circuits, one output RF signal for each set of carriers, where M>1. Each set of carriers may include one or more carriers in a single band (e.g., intra-band CA) or across multiple bands (e.g., inter-band CA).

Figure 5:
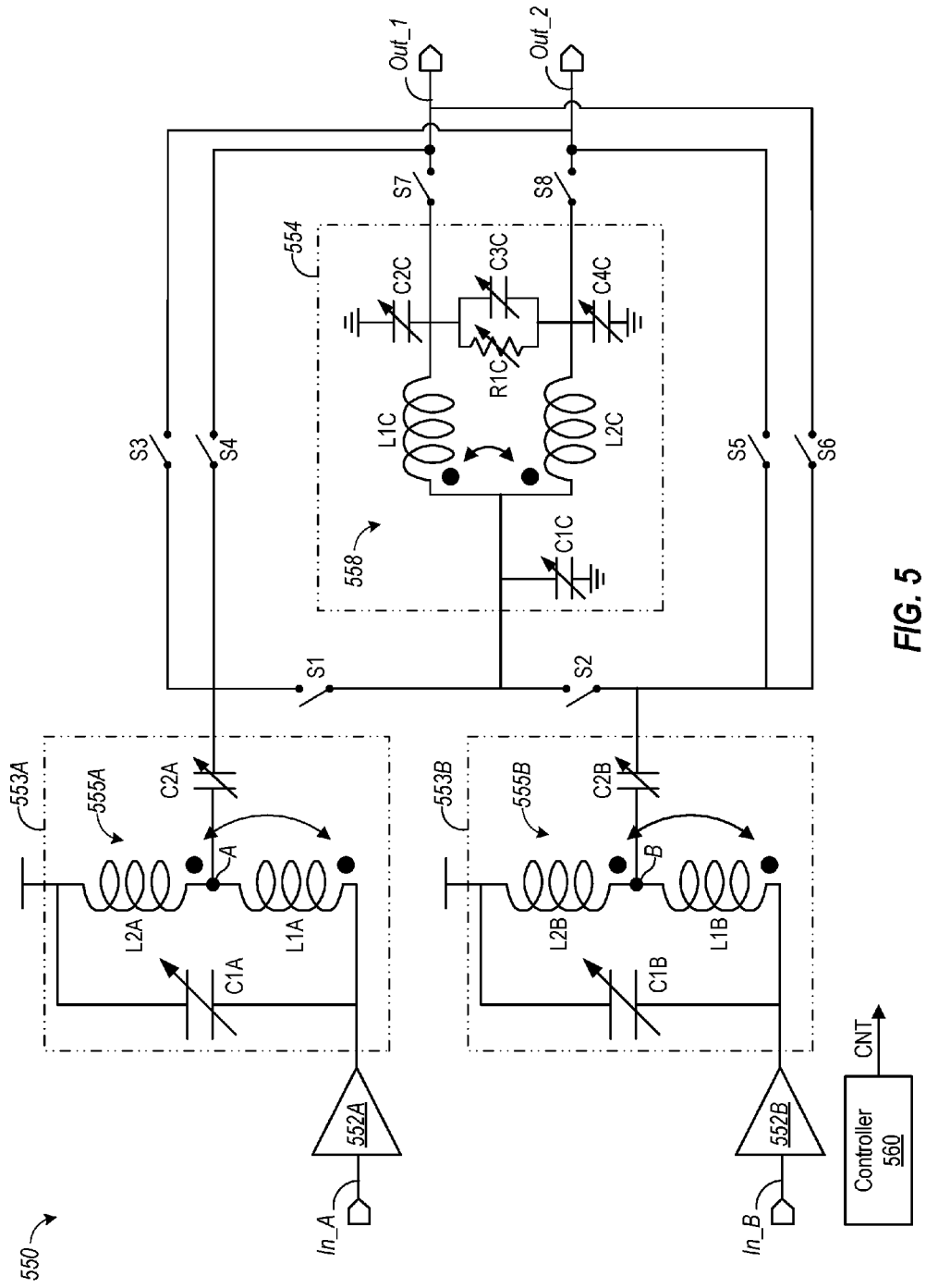
FIG. 5 illustrates a device including a low-noise amplifier switchably coupled to a power splitter, according to an aspect of the present disclosure.

FIG. 5 depicts a device 550, according to an exemplary aspect of the present disclosure. Device 550 includes a first LNA 552A including an input In_A and an output, which is coupled to the output load and matching circuit 553A. Matching circuit 553A includes a variable capacitor C1A (e.g., multiple sections, butterfly, split stator, or differential) and a transformer 555A including an inductor L1A and an inductor L2A. Of course, other configurations of the matching circuit are also are possible. For example, in some aspects, Matching circuit 553A may be configured using resistors for matching, by removing a capacitor (e.g., C1A), or using other equivalent circuits thereof for matching circuit 553A. In some aspects, the device 550 may perform matching without a transformer, without a capacitor, or can use a resistor, or other equivalent circuits. Matching circuit 553A may further include a variable capacitor C2A coupled to a node A between inductors L1A and L2A. Device 550 may also include a second LNA 552B including an input In_B and an output, which is coupled to a matching circuit 553B. Matching circuit 553B may further include a variable capacitor C1B and a transformer 555B, which includes inductor L1B and an inductor L2B. Matching circuit 553B further includes a variable capacitor C2B coupled to a node B between inductor L1B and L2B. It is noted that LNA 552B and matching circuit 553B may be used in conjunction with LNA 552A and matching circuit 553A, and share a power splitter 554, to operate in an inter-band or intra-band mode, as will be appreciated by a person having ordinary skill in the art.

Power splitter 554 may include a variable capacitor C1C, a transformer 558, variable capacitors C2C, C3C, and C4C, and a variable resistor R1C. As will be appreciated, by tuning variable resistor RC1, one or more of variable capacitors C1C, C2C, C3C, and C4C, or any combination thereof, isolation between signals at outputs Out_1 and Out_2 of power splitter 554 may be varied. As one example, provided without limitation, in one tuner setting, the isolation at approximately 2.6 GHz may be approximately −46.58 dB. Various other tuner settings having a variety of other isolations can also be achieved. In related aspects, there can be more than two outputs to account for when CA is greater than two.

Transformer 558 may comprise, without limitation, a quarter-wave transformer, a triple-coil transformers, etc. Transformer 558 may include an inductor L1C and an inductor L2C. Device 550 may further include a plurality of switches S1-S8, and outputs Out_1 and Out_2. Outputs Out_1 and Out_2 may be configured to couple to another device. For example, each of output Out_1 and output Out_2 may couple to downconversion circuitry. Using the power splitter 554 is beneficial because it offers good signal isolation and linearity.

The variable capacitors C1C, C2C, C3C, and C4C may be implemented as switched capacitors, where switches and different sizes of capacitors are connected in an array. In related aspects, fixed capacitors may be used if the specified signal bandwidth is limited to some particular band. In additional related aspects, variable capacitors may be used, where the capacitor value can be continuously tuned with voltages. The variable resistor R1C may be implemented as a switched resistor, where switches and different sizes of resistors are connected in an array.

Device 550 also includes the reconfigurable switches S1-S8. S3 and S4 are switches connected to an output matching circuit 553A, so that the LNA 552A can conduct an output signal to output ports Out_1 and Out_2 directly. S5 and S6 are switches connected to an output of matching circuit 553B, so that the LNA 552B can conduct an output signal to output ports Out_1 and Out_2 directly. S1 and S2 are connected to the LNA 552A and LNA 552B, respectively, and conduct the output signal of either LNA 552A or LNA 552B so that it can go through power splitter 554, where the signal is split into two output paths that travel through switches S7 and S8, and then to the two output ports Out_1 and Out_2.

By combining these output switches S1-S8 with tunable power splitter 554, LNA 552 can generate multiple outputs together with tunable isolations. Power splitter 554 will also match to the output impedance without the need to add extra matching networks.

In addition, device 550 may include, or may be in communication with, a controller 560 configured for controlling operation of one or more components of one or more matching circuits (e.g., 553A, 553B) and power splitter 554. As one example, controller 560 may generate and convey one or more control signals CNT to vary one or more variable capacitors of device 550, variable resistor R1C of device 550, one or more transformers of device 550, or any combination thereof. Additionally, opening and closing of switches S1-S8 may be controlled by controller 560 in order to determine whether one or both matching circuit 553 is coupled to power splitter 554. For example, control signal CNT can be used for controlling switches S1-S8.

Figure 6:
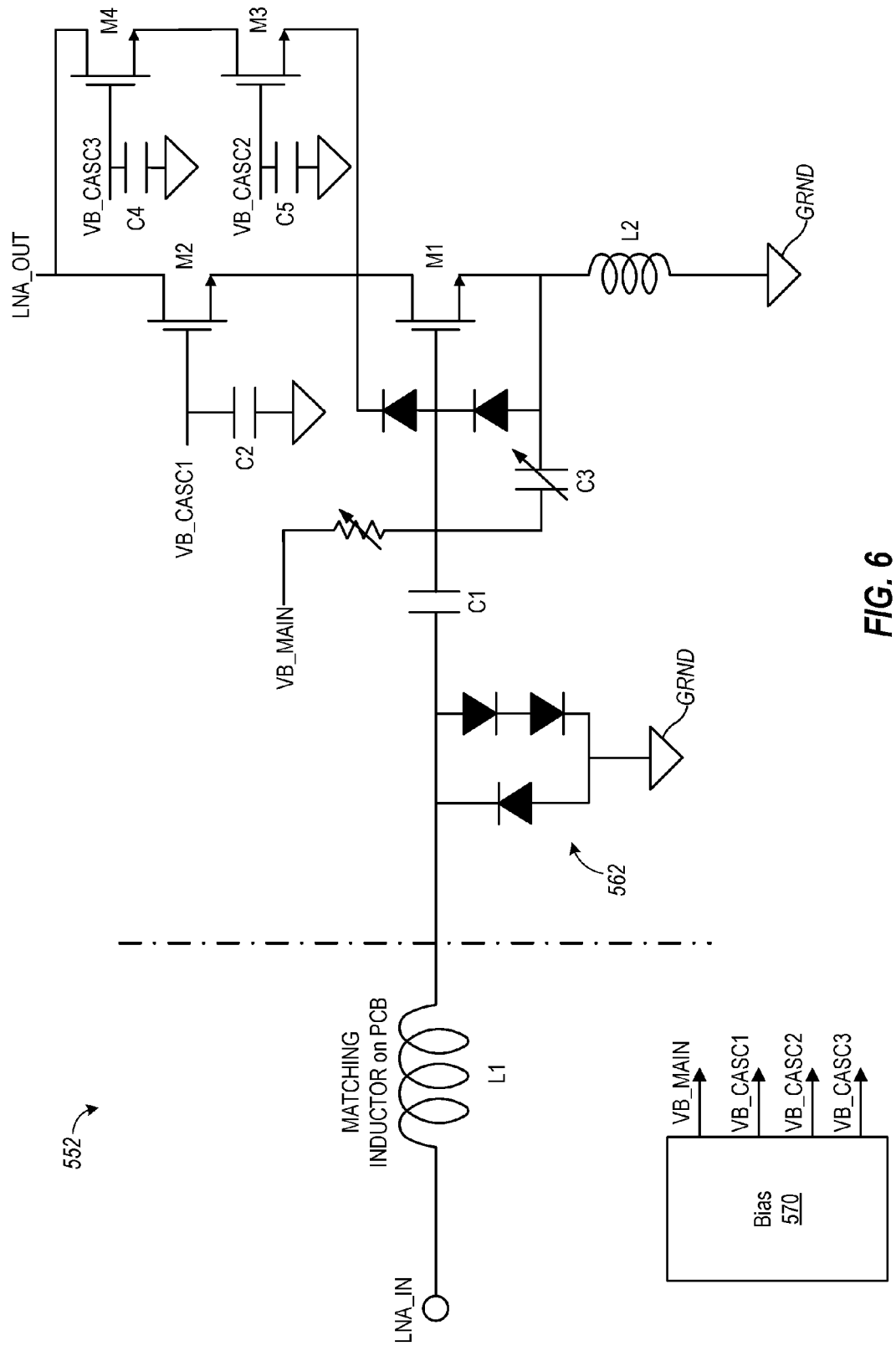
FIG. 6 depicts a low-noise amplifier, in accordance with an aspect of the present disclosure.

FIG. 6 depicts LNA 552, which may comprise LNA 552A and LNA 552B of FIG. 5. LNA 552 includes an input LNA_IN, an inductor L1, an electrostatic discharge (ESD) protection device 562, a DC blocking capacitor C1, bias filtering capacitors C2, C4, and C5, and a capacitor C3, which may comprise a variable capacitor. LNA 552 further includes an inductor L2, a main transistor M1, a three cascade transistor comprising M2, M3, and M4, and an output LNA_OUT.

As illustrated in FIG. 6, transistor M1 amplifies the signal from LNA_IN and generates a current to feed through the source of cascode transistors M2 and M3. Cascode transistors M2, M3 and M4 can behave as two branches. One branch can be a single cascode branch comprising M2, while the other branch can be a double cascode branch comprising M3 and M4. The drains of M2 and M4 are connected together so that the current of both branches can be combined. The single cascode branch and double cascode branch can be controlled to be either in an on or off state so that the gain of the LNA 552 can be changed according to the operation mode.

The gate of transistor M1 is coupled to capacitor C1, which is further coupled to inductor L1. Inductor L1 can also be coupled to input LNA_IN. Inductor L2 is coupled between transistor M1 (e.g., a source of transistor M1) and a ground voltage GRND, transistor M2 is coupled to transistor M1, and transistor M2 is coupled to output LNA_OUT. Moreover, a gate of transistor M1 is coupled to a source of transistor M1 via capacitor C3. In some aspects, capacitor C3 may be implemented as a switched capacitor array, so that the input impedance of LNA 552 could be tuned and optimized with different source impedance. The NF and linearity may also be improved with different settings of capacitor C3.

In addition, LNA 552 may include, or may be in communication with, a bias block 570 configured for generating a bias voltage for M1, M2, M3, and M4, corresponding to bias voltages VB_MAIN, VB_CASC1, VB_CASC2 and VB_CASC3. Different bias voltages can be generated according to the gain, noise figure and linearity requirement of LNA. The bias block 570 will generate the bias voltage for M1, M2, M3, and M4 so that only one of the single cascode branch and double cascode branch can be turned on at a given time, so that the noise contribution of M2, M3 and M4 to the LNA output LNA_OUT can be improved.

The benefit of implementing a single cascode branch and a double cascode branch is to improve the gain since the output impedance of the double cascode branch is higher than the single cascode branch, and the input-output isolation of the double cascode branch is also improved. However, a single cascode branch can offer better linearity and larger output swing within a given supply voltage.

Figure 7:
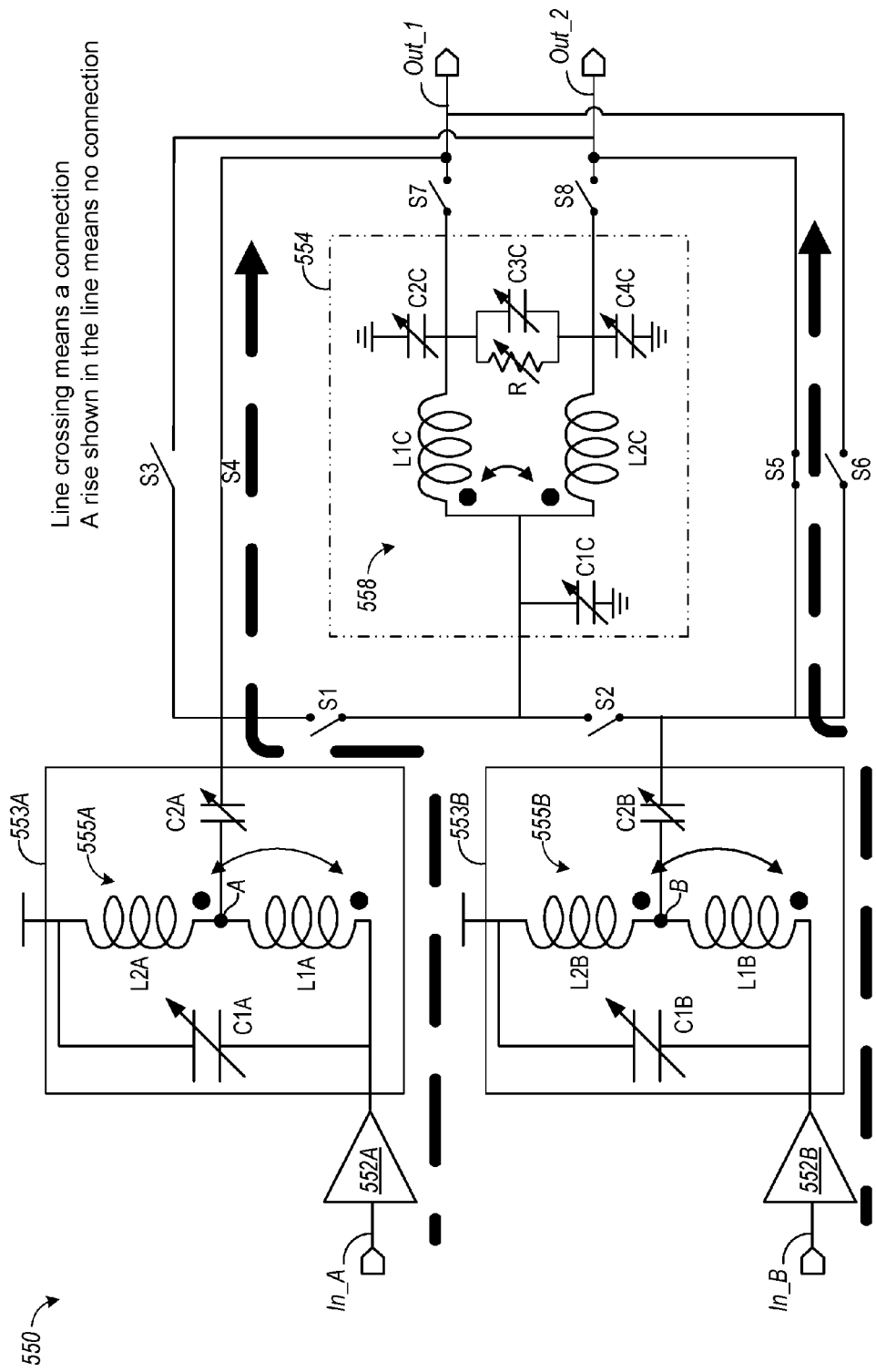
FIG. 7 illustrates an exemplary operation of the device of FIG. 5 in accordance with aspects of the present disclosure.

FIG. 7 illustrates an exemplary operation of device 550 in accordance with aspects of the present disclosure. More specifically, FIG. 7 illustrates device 550 operating in legacy/inter-CA mode or intra-CA mode, wherein power splitter 554 is bypassed (shown by the dashed line along the alternate paths between IN_A and Out_1 and IN_B and Out 2). More specifically, in this contemplated operation, switches S1 and S2 may be open and switches S3 and S4 may be closed. Thus, the output of matching circuit 553A is coupled to at least one of output Out_1 and output Out_2. Alternatively, at least one of switches S3 or S4 may be closed to couple one of output Out_1 or Out_2 to matching circuit 553A. Similarly, at least one of switches S5 or S6 may be closed to couple at least one of outputs Out_1 or Out_2 to matching circuit 553B. For example, as shown in FIG. 7, LNA 552A can be coupled to Out_1 and LNA 552B can be coupled to Out_2 by opening switches S1, S2, S3, and S6, and closing switches S4 and S5. By controlling switches S1-S6, device 550 can be dynamically controlled to function in various inter-band CA or intra-band CA configurations. In an aspect, values of NF, linearity, and power consumption may be improved without introducing excessive parasitic values at the input of device 550.

Figure 8:
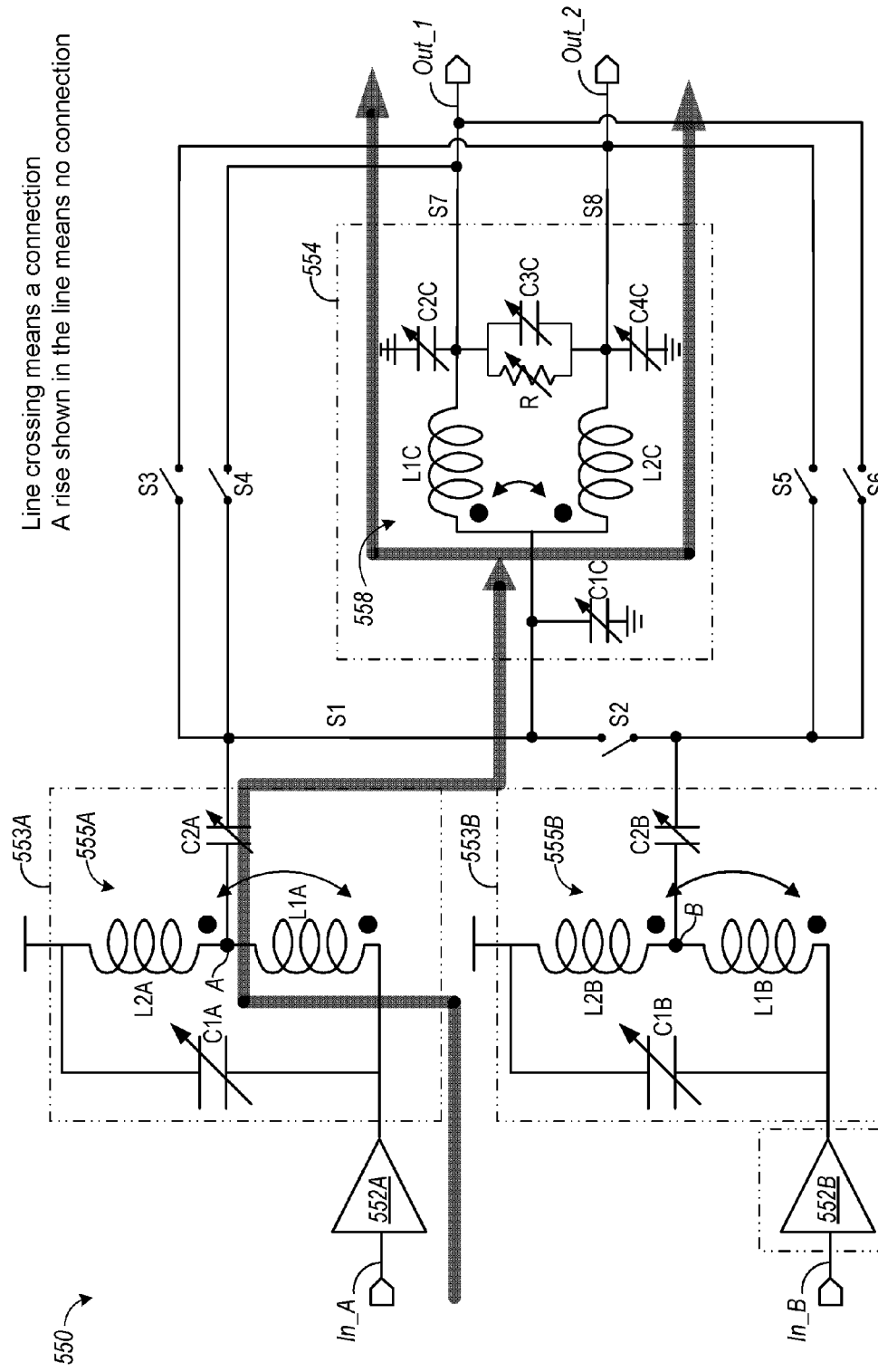
FIG. 8 illustrates another exemplary operation of the device of FIG. 5 in accordance with aspects of the present disclosure.

FIG. 8 illustrates another exemplary operation of device 550 in accordance with aspects of the present disclosure. More specifically, FIG. 8 illustrates an example of device 550 operating in an intra-CA mode (shown by way of multiple output paths). In this contemplated operation, a signal may be conveyed from matching circuit 553A to power splitter 554 via switch S1, which may be in a closed configuration. Further, in this aspect, switches S4 and S3 may be in an open configuration. During this contemplated operation, power splitter 554 may split an input signal into two equal phase output signals. Power splitter 554 may utilize one or more quarter-wave transformers to match output ports to an input port. Because a loss-less reciprocal three-port network cannot have all ports simultaneously matched, one resistor R may be added between the two output ports. In addition to matching all three ports, resistor R may isolate the two output ports from one another at the center frequency. Further, the resistor R may not add resistive loss from the input port to output ports.

By opening switch S1 and closing switch S2, while leaving switches S3-S6 open, LNA 552B can be coupled to power splitter 554 so that the LNA 552B can operate in intra-CA mode, for example. The sharing of power splitter 554 between LNA 552A and LNA 552B reduces the chip area and thus reduces the chip cost.

In one exemplary aspect, power splitter 554 can comprise a Wilkinson power splitter. The Wilkinson power splitter is a well-known device in the RF/microwave community used for splitting or combining signals. A conventional Wilkinson power splitter is composed of simple transmission lines and a resistor, and takes advantage of the properties of quarter wavelength transmission line sections to provide ideal power divider characteristics. According to aspects of the present disclosure, the power splitter 554 may be an on chip transformer, offering high level of isolation tenability and aggressive area reduction.

According to aspects of the present disclosure, the power splitter 554 splits the signal equal-amplitude, equal-phase output signals from the splitter input to the splitter output (Out_1 and Out_2) with some switch losses. L1C, C2C and half of C1C are implemented as a quarter-wave length transmission line in the desired frequency. By deriving the terminal impedance at the input, the terminated impedances at output ports Out_1 and Out_2 will be converted through the quarter-wave length transmission line and then combined together at the input. For example, the quarter-wave length transmission line characteristic impedance can be set, without limitation, to 1.414×Z0, so that the input is matched when ports 2 and 3 are terminated in Z0.

In one example, the isolation of power splitters 554 may be at least 6 dB better than the return loss of the source match at input port In_A. A return loss of power splitter 554 may be no better than a return loss observed by power splitters 554 at input port In_A.

The resistor R and the capacitor C3C are implemented as 2×Z0 between the two outputs. R could also be tuned with different Z0 impedances, or tuned if the process and/or temperature changes. Because each end of an isolation resistor R between output ports Out_1 and Out_2 is at the same potential, no current flows through the resistor R, and therefore the resistor R is decoupled from input port In_A.

One or more of capacitors C1C/C2C/C3C/C4C may be used to tune a center frequency under different CA operations. One or more of capacitors C1C/C2C/C3C/C4C may also be used to tune the center frequency when the process and/or temperature changes.

It is noted that power splitter 554 may be configured with improved insertion loss and CA isolation. It is further noted that there may be a small NF difference at intra-CA mode because the signal is splitting at outputs Out_1 and Out_2. Further, gain degradation can be compensated back with current bias or programmable degeneration. Compared to other CA LNA topologies, CA isolation may be tuned independently without reducing the NF/linearity performance. For example, one or more of capacitors C1C/C2C/C3C/C4C and resistor R can be used to tune power splitter 554 independently of LNA 552.

It is further noted that in each of the aspects shown in FIGS. 5 and 6, LNA 552B is not receiving a signal and, therefore, neither LNA 552B nor matching circuit 553B may contribute to an output (e.g., at outputs Out_1 and Out_2). However, as noted above, in one exemplary aspect, LNA 552B and matching circuit 553B may be used in conjunction with LNA 552A and matching circuit 553A, and power splitter 554 may be shared (e.g., receive a signal from matching circuit 553A and a signal from matching circuit 553B), to operate in an inter-band mode, as will be appreciated by a person having ordinary skill in the art. For example, switches S1 and S2 may be closed, and switches S3-S6 may be opened, to allow input signals In_A and In_B to pass through to power splitter 554. In related aspects, switches S1 and S2 may be closed simultaneously, or alternated to close at alternating times, while switches S3-S6 remain open, to keep signals In_A and In_B separated.

Figure 9:
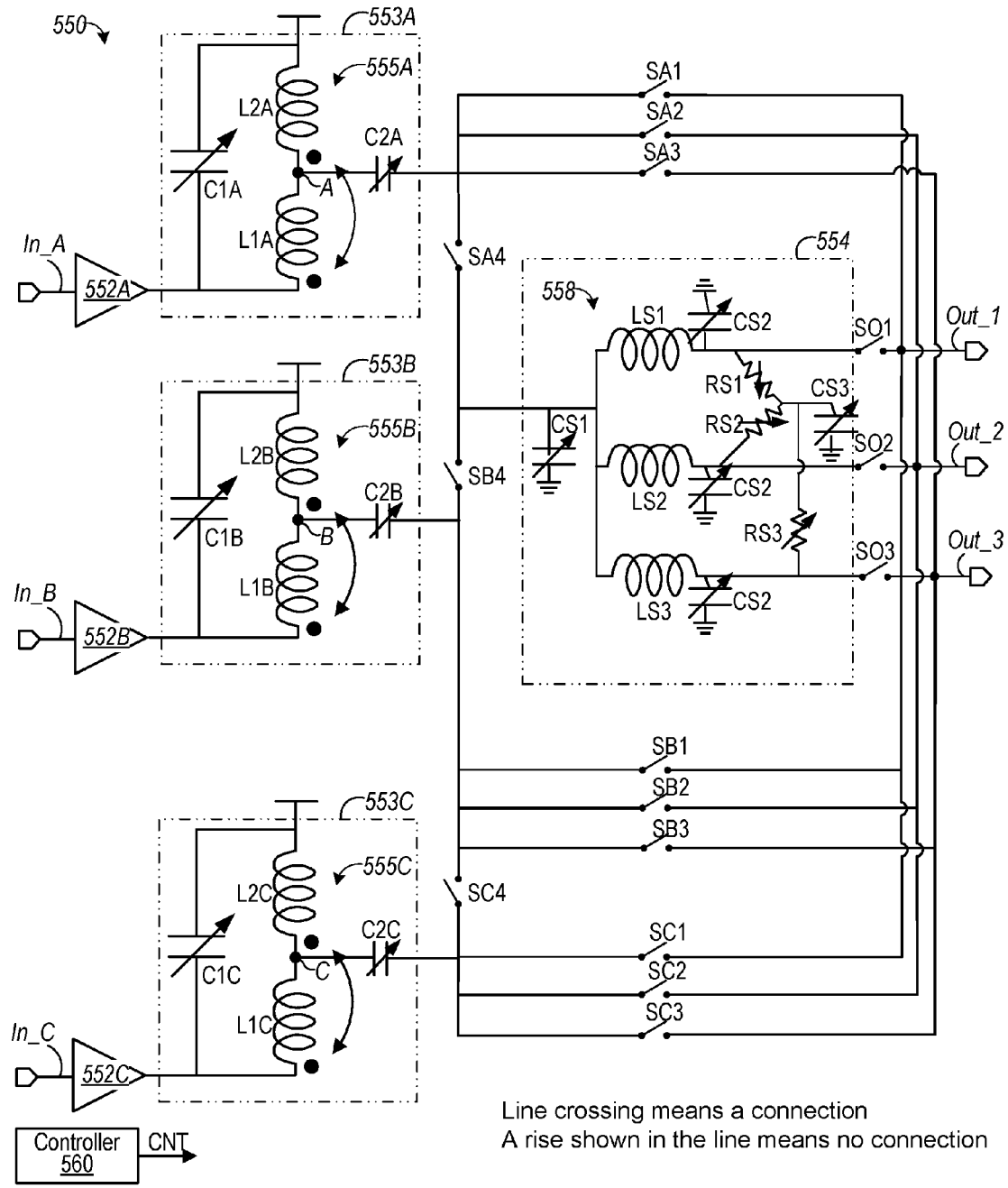
FIG. 9 illustrates a device including a low-noise amplifier switchably coupled to a power splitter, according to another aspect of the present disclosure.

FIG. 9 illustrates a device 550 including a low-noise amplifier with a tunable integrated power splitter, supporting three contiguous intra-band carrier aggregation (CA), according to an aspect of the present disclosure.

In FIG. 9, device 550 includes three LNA devices, 552A, 552B and 552C, all implemented as shown in FIG. 6. Each LNA device 552A, 552B and 552C is connected to the output loading and matching circuits 553A, 553B, and 553C. By configuring the switches SA1-SA3, SB1-SB3 and SC1-SC3 accordingly, the three LNAs 552A, 552B and 552C can be configured for inter-band CA mode, where the three input signals at the input nodes, In_A, In_B, and In_C, can be amplified and coupled to Out_1, Out_2, and Out_3, respectively. Each LNA 552A, 552B and 552C can connect to either Out_1, Out_2, or Out_3 such that different downlink paths can be utilized.

In addition, device 550 has a power splitter 554 (e.g., a single-input-triple-output splitter) for supporting three contiguous intra-band CA. Power splitter 554 includes a transformer including three inductors (e.g., inductor coils) LS1, LS2, and LS3, and tunable capacitors CS1, CS2, and CS3. Three resistors RS1, RS2, and RS3 are added across the splitter output to tune the impedance, so that the isolation between Out_1, Out_2, and Out_3 can be improved. Similar to device 550 in FIG. 5, the power splitter 554 splits the signal with equal-amplitude and equal-phase to output signals from the splitter input to the splitter output (Out_1, Out_2 and Out_3) with some switch losses. LS1, CS2 and one third of CS1, are implemented as a quarter-wave length transmission line in the desired frequency. The characteristic impedance of the quarter-wave lines can be equal, without limitation, to 1.732×Z0, and the resistors RS1, RS2, and RS3 can be implemented, without limitation, as 3×Z0 between the two outputs.

One or more of capacitors CS1/CS2/CS3 may be used to tune a center frequency under different CA operations. One or more of capacitors CS1/CS2/CS3 and resistors RS1/RS2/RS3 may also be used to tune the center frequency when the process and/or temperature changes.

Figure 10:
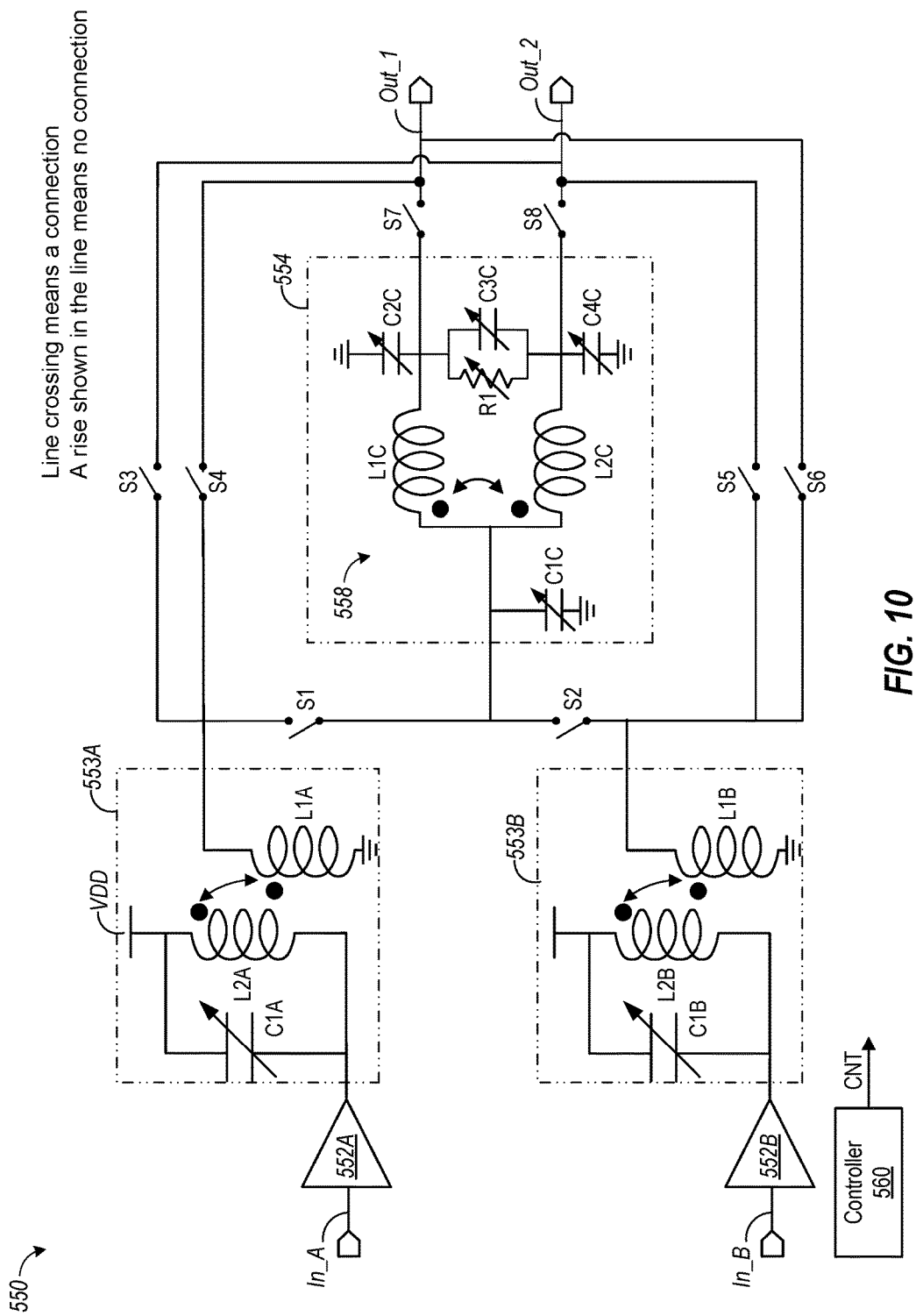
FIG. 10 illustrates a device including a low-noise amplifier switchably coupled to a power splitter, according to another aspect of the present disclosure.

FIG. 10 illustrates a device 550 including a low-noise amplifier (LNA) 552 with tunable integrated power splitter 554, with an alternative matching circuit 553 between LNA output and splitter input, according to another aspect of the present disclosure.

In FIG. 10, L1A and L2A are implemented in such a way that C2A and C2B (see FIG. 9) are removed in FIG. 10. L2A is connected between a power source (e.g., a VDD) and an output of LNA 552A, while L1A couples the signal from L2A and feeds the signal to power splitter 554 input through switches S1. The other side of L1A is coupled to the ground. The coupling co-efficient and inductance value can be designed to implement appropriate voltage gain at the output of LNA 552A and appropriate impedance translation from the output of LNA 552A.

Because C2A and C2B are removed, additional space is saved on the device 550. The outputs of transformers L1A and L1B can also be DC coupled to switches S1-S6.

Figure 11:
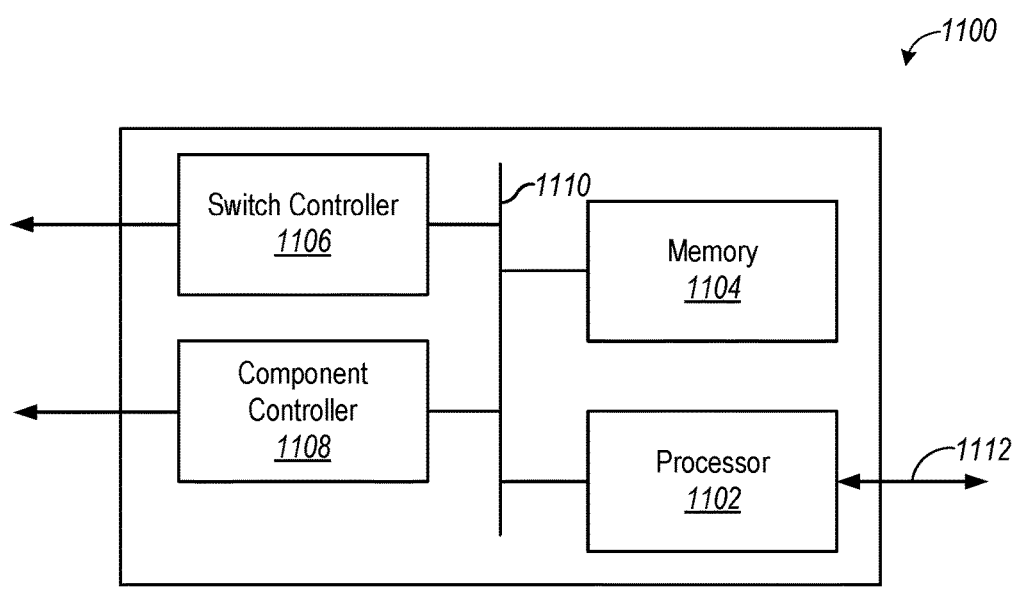
FIG. 11 illustrates an aspect of a controller for use with one or more of the devices disclosed herein.

FIG. 11 shows an exemplary controller 1100 for use with device 550 shown in FIGS. 5-8. For example, controller 1100 is suitable for use as the controller 380 shown in FIG. 3 and/or controller 560 shown in FIG. 5. Controller 1100 comprises processor 1102, memory 1104, switch controller 1106, and component controller 1108. Processor 1102, memory 1104, switch controller 1106, and component controller 1108 may all be electrically coupled to communication bus 1110 to communicate with each other.

Processor 1102 comprises a CPU, processor, gate array, hardware logic, discrete circuits, memory elements, and/or hardware executing software. Processor 1102 operates to control the other functional elements of controller 1100 using communication bus 1110. Processor 1102 can execute instructions stored in memory 1104 or operate in accordance with instructions, commands, data, or other information received over a processor control line 1112. In an exemplary aspect, another entity (not shown) at the device generates the information on processor control line 1112.

Memory 1104 comprises any suitable memory or storage device that allows for storing, retrieving, and maintaining instructions and/or data associated with the operation of controller 1100. In an exemplary aspect, memory 1104 stores algorithm instructions that can be executed by processor 1102 to perform the functions of the dual stage LNA as described herein.

Switch controller 1106 may be a single unit or in some aspects, may be distributed over multiple units. Switch controller 1106 may, for example, comprise hardware, such as amplifiers, buffers, registers, gates, transistors, analog to digital converters, digital to analog converters or any other suitable hardware or discrete components and/or hardware executing software that operates to output control signals to the switches used in the various exemplary aspects described above. In one exemplary aspect, processor 1102 may operate to determine switch settings for one or more of the switches used in the various aspects and pass these switch settings to switch controller 1106. Switch controller 1106 may output one or more control signals to the designated switches to adjust their switch settings according to the determinations made by processor 1102. In an exemplary aspect, processor 1102 determines that the switch settings of switches S1-S6 (see e.g., FIG. 5) are to be changed to new switch settings. Processor 1102 sends the new switch settings to switch controller 1106, which outputs the one or more control signals to switches S1-S6 for the new switch settings. In an exemplary aspect, switch controller 1106 is configured to output analog and/or digital control signals as necessary.

Component controller 1108 may be a single unit or may be distributed over multiple units, and may for instance, comprise hardware, such as amplifiers, buffers, registers, gates, transistors, analog-to-digital converters, digital to analog converters or any other suitable hardware or discrete components and/or hardware executing software that may operate to output control signals to tune the operation of variable resistors, variable capacitors, and transformers (e.g., a triple-coil transformer) of device 550 (see e.g., FIG. 5). For example, processor 1102 may operate to determine operating parameters (e.g., frequency tunings) for each of the transformer circuits and variable components (e.g., variable capacitors and variable resistors) and passes these adjustments to component controller 1108. More specifically, for example, component controller 1108 may output signals to tune one or more components of power splitter 554 (see e.g., FIG. 5). Component controller 1108 outputs control signals to adjust the operation of the device 550 according to the determinations made by processor 1102.

It should be noted that controller 1100 represents just one implementation and that other implementations are possible. For example, controller 1100 may be implemented in discrete logic that eliminates the need for a processor or memory devices. In another implementation, the functions and/or implementations of controller 1100 are incorporated or integrated into a baseband processor or other entity at the receiving device.

According to another exemplary aspect, the present disclosure includes methods for operating a wireless receiver. Various aspects of such a method may include amplifying a signal with a low-noise amplifier (LNA). The method may further include configuring at least one switch to either convey the amplified signal to at least one output or convey the amplified signal to the at least one output via a power splitter.

Figure 12:
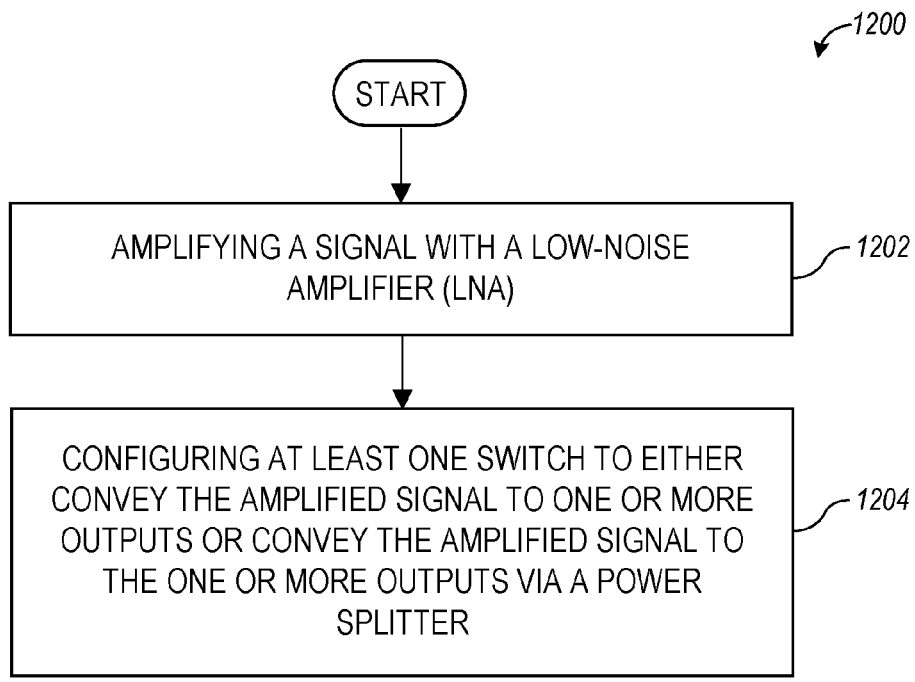
FIG. 12 is a flowchart depicting a method, in accordance with an aspect of the present disclosure.

FIG. 12 is a flowchart illustrating a method 1200, in accordance with aspects of the present disclosure. Method 1200 may amplify a signal with a low-noise amplifier (LNA) (block 1202). Method 1200 may also include configuring at least one switch to either convey the amplified signal to one or more outputs or convey the amplified signal to the one or more outputs via a power splitter (block 1204).

Figure 13:
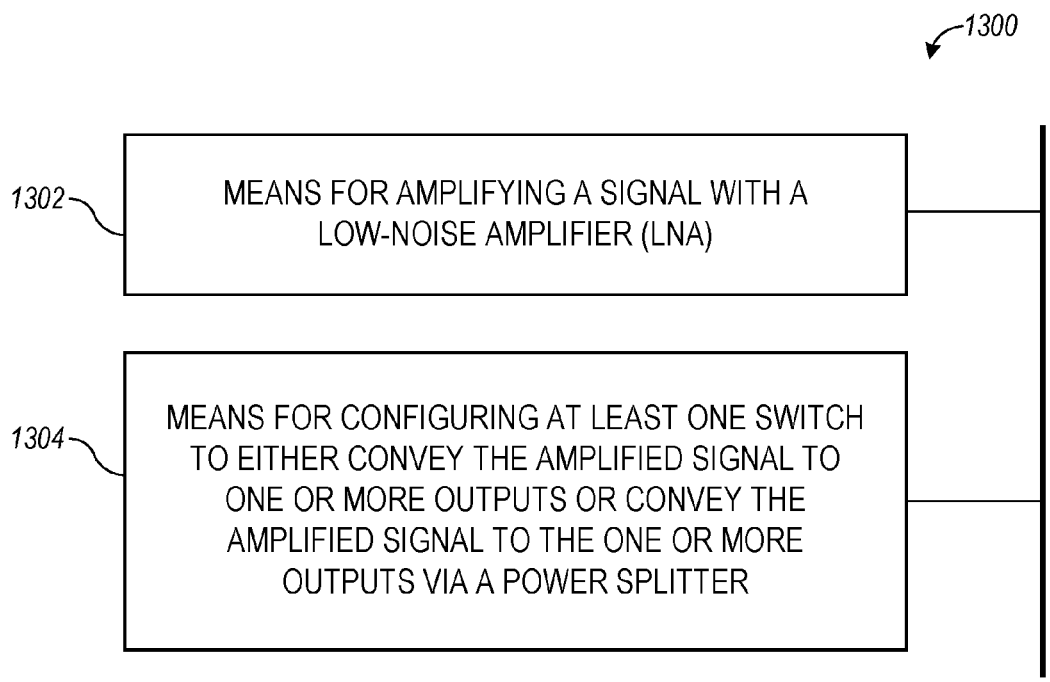
FIG. 13 shows a low-noise amplifier device, according to an aspect of the present disclosure.

FIG. 13 shows an exemplary amplifier device 1300 in accordance with aspects of the present disclosure. For example, device 1300 is suitable for use as device 550 of FIG. 5. In an aspect, device 1300 is implemented by one or more modules configured to provide the functions as described herein. For example, in an aspect, each module comprises hardware and/or hardware executing software.

Device 1300 comprises a first module comprising means (1302) for amplifying a signal with a low-noise amplifier (LNA). For example, means 1302 may comprise LNA 552A of FIG. 5.

Device 1300 also comprises a second module comprising means (1304) for configuring at least one switch to either convey the amplified signal to one or more outputs or convey the amplified signal to the one or more outputs via a power splitter For example, means 1304 may include controller 560 of FIG. 5.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

In one or more exemplary aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

It is noted that combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C.

The previous description of the disclosed exemplary aspects is provided to enable any person skilled in the art to make or use the present disclosure. Various modifications to these exemplary aspects will be readily apparent to those skilled in the art, and the generic principles defined herein may be applied to other aspects without departing from the spirit or scope of the disclosure. Thus, the present disclosure is not intended to be limited to the exemplary aspects shown herein but is to be accorded the widest scope consistent with the principles and novel features disclosed herein.

What is claimed is:

1. A device, comprising:
   a low-noise amplifier (LNA);
   a matching circuit coupled to an output of the LNA and switchably coupled to one or more outputs of the device;
   a power splitter switchably coupled between an output of the matching circuit and the one or more outputs of the device; and
   at least one first switch configured to couple the matching circuit to the power splitter.

2. The device of claim 1, in which the power splitter comprises:
   a first variable capacitor coupled between a ground voltage and an input of the power splitter;
   a transformer coupled between the input of the power splitter and at least one output of the power splitter; and
   at least one variable capacitor and a variable resistor coupled between the at least one output of the power splitter and the transformer.

3. The device of claim 1, further comprising at least one second switch configured to couple the matching circuit to the one or more outputs.

4. The device of claim 1, in which the matching circuit comprises:
   a variable capacitor coupled between an output of the LNA and a ground;
   at least one inductor coupled between the ground and the output of the LNA; and
   a second variable capacitor coupled between the at least one inductor and the output of the matching circuit.

5. The device of claim 1, further comprising:
   at least one second LNA; and
   at least one second matching circuit coupled to an output of the at least one second LNA and switchably coupled to the one or more outputs, the power splitter switchably coupled between an output of the at least one second matching circuit and the one or more outputs.

6. The device of claim 5, further comprising at least one second switch configured to couple the at least one second matching circuit to the one or more outputs.

7. The device of claim 5, further comprising at least one second switch configured to couple the at least one second matching circuit to the power splitter.

8. The device of claim 1, in which the LNA comprises:
a first transistor coupled to an output; and
a second transistor coupled between the first transistor and a ground, the second transistor further coupled to an input.

9. The device of claim 8, further comprising a variable capacitor coupled between a gate of the second transistor and a source of the second transistor.

10. The device of claim 8, further comprising at least one of an inductor and a capacitor coupled between the input of the LNA and the second transistor.

11. The device of claim 1, in which the power splitter comprises at least one tunable component for tuning the power splitter.

12. The device of claim 1, further comprising at least one controller configured to control at least one component of at least one of the matching circuit or the power splitter.

13. A method, comprising:
amplifying a signal with a low-noise amplifier (LNA); and
configuring at least one switch to convey the amplified signal to one or more outputs or to convey the amplified signal to the one or more outputs via a power splitter, the configuring comprises bypassing the power splitter.

14. The method of claim 13, further comprising tuning the power splitter to adjust isolation between the one or more outputs.

15. The method of claim 13, further comprising adjusting at least one variable component of a matching circuit coupled to the LNA.

16. A device, comprising:
means for amplifying a signal; and
means for configuring at least one switch to convey the amplified signal to one or more outputs or to convey the amplified signal to the one or more outputs via a power splitter, in which the means for configuring comprises means for bypassing the power splitter.

17. The device of claim 16, further comprising means for tuning at least one component of at least one of a matching circuit coupled to the means for amplifying and the power splitter.

18. The device of claim 16, further comprising means for matching an impedance at an output of the amplifying means.

19. A device, comprising:
a low-noise amplifier (LNA);
a matching circuit coupled to an output of the LNA and switchably coupled to one or more outputs of the device; and
a power splitter switchably coupled between an output of the matching circuit and the one or more outputs of the device, the power splitter comprising:
a first variable capacitor coupled between a ground voltage and an input of the power splitter;
a transformer coupled between the input of the power splitter and at least one output of the power splitter; and
at least one variable capacitor and a variable resistor coupled between the at least one output of the power splitter and the transformer.

20. A device, comprising:
a low-noise amplifier (LNA);
a matching circuit coupled to an output of the LNA and switchably coupled to one or more outputs of the device;
a power splitter switchably coupled between an output of the matching circuit and the one or more outputs of the device; and
at least one controller configured to control at least one component of at least one of the matching circuit or the power splitter.

* * * * *